(12) United States Patent
Tasaka et al.

(10) Patent No.: US 8,179,492 B2
(45) Date of Patent: *May 15, 2012

(54) LIQUID CRYSTAL DISPLAY DEVICE

(75) Inventors: Yasutoshi Tasaka, Kanagawa (JP);
Yohei Nakanishi, Nara (JP); Masakazu Shibasaki, Mie (JP); Tsuyoshi Kamada, Kanagawa (JP); Hidefumi Yoshida, Kanagawa (JP); Hideaki Tsuda, Kanagawa (JP)

(73) Assignee: Sharp Kabushiki Kaisha, Osaka (JP)

( * ) Notice: Subject to any disclaimer, the term of this patent is extended or adjusted under 35 U.S.C. 154(b) by 9 days.

This patent is subject to a terminal disclaimer.

(21) Appl. No.: 12/923,733

(22) Filed: Oct. 6, 2010
(Under 37 CFR 1.47)

(65) Prior Publication Data

US 2011/0037915 A1 Feb. 17, 2011

Related U.S. Application Data

(62) Division of application No. 11/390,465, filed on Mar. 28, 2006, now Pat. No. 7,834,949.

(30) Foreign Application Priority Data

Mar. 29, 2005 (JP) ................................. 2005-094896

(51) Int. Cl.
*G02F 1/136* (2006.01)
*G02F 1/1343* (2006.01)

(52) U.S. Cl. ................ 349/48; 349/38; 349/39; 349/46; 349/143; 349/144; 349/146

(58) Field of Classification Search .................... 349/48, 349/38, 39, 46, 143, 144, 146
See application file for complete search history.

(56) References Cited

U.S. PATENT DOCUMENTS 4,840,460 A 6/1989 Bernot et al.
5,126,865 A 6/1992 Sarma
(Continued)

FOREIGN PATENT DOCUMENTS

JP 02-000012 1/1990
(Continued)

OTHER PUBLICATIONS

U.S. Appl. No. 11/390,465, filed Mar. 28, 2006; Tasaka et al.

*Primary Examiner* — Mark Robinson
*Assistant Examiner* — Charles Chang
(74) *Attorney, Agent, or Firm* — Nixon & Vanderhye P.C.

(57) ABSTRACT

The invention relates to a liquid crystal display device and provides a liquid crystal display device which can achieve high display quality. A liquid crystal display device is provided with first and second TFTs each having a gate electrode connected to an nth gate bus line and a drain electrode connected to a drain bus line; a first pixel electrode connected to a source electrode of the first TFT; a second pixel electrode connected to a source electrode of the second TFT; a third TFT having a gate electrode connected to an (n+1)th gate bus line and a source electrode connected to the second pixel electrode; and a buffer capacitance portion having a buffer capacitance electrode which is formed in the same layer as the first and second pixel electrodes and is connected to a drain electrode of the third TFT and a buffer capacitance electrode connected to a storage capacitance bus line. The buffer capacitance portion establishes capacitive coupling between the drain electrode of the third TFT and the storage capacitance bus line.

20 Claims, 20 Drawing Sheets

U.S. PATENT DOCUMENTS

| | | |
|---|---|---|
| 7,834,949 B2 * | 11/2010 | Tasaka et al. .................... 349/48 |
| 2004/0001167 A1 | 1/2004 | Takeuchi et al. |
| 2005/0036091 A1 * | 2/2005 | Song ............................. 349/129 |
| 2006/0023137 A1 | 2/2006 | Kamada et al. |
| 2006/0103800 A1 | 5/2006 | Li et al. |

FOREIGN PATENT DOCUMENTS

| | | |
|---|---|---|
| JP | 3076938 | 6/2000 |
| JP | 2003-255303 | 9/2003 |
| JP | 2004-078157 | 3/2004 |

* cited by examiner

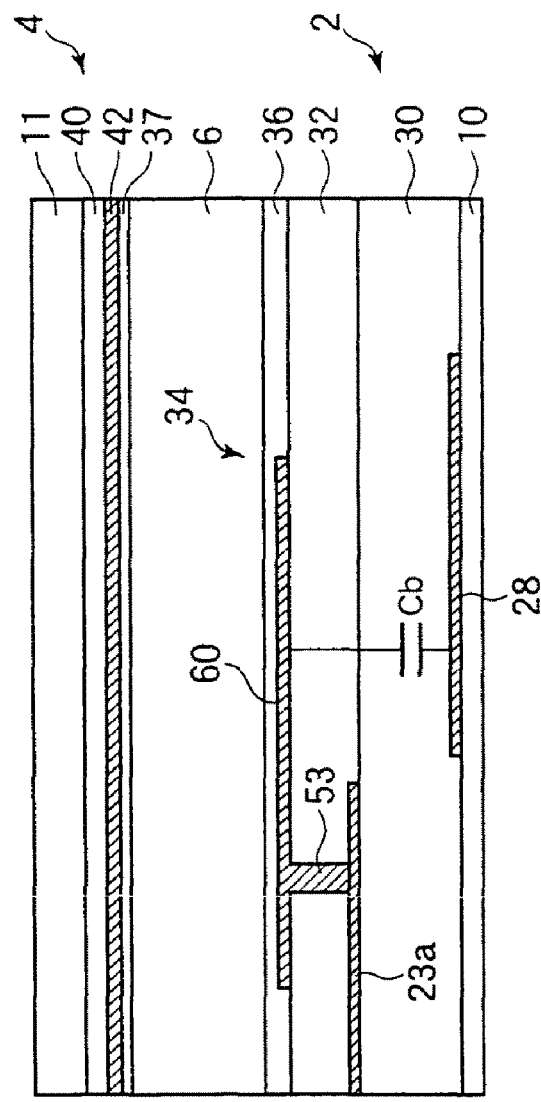
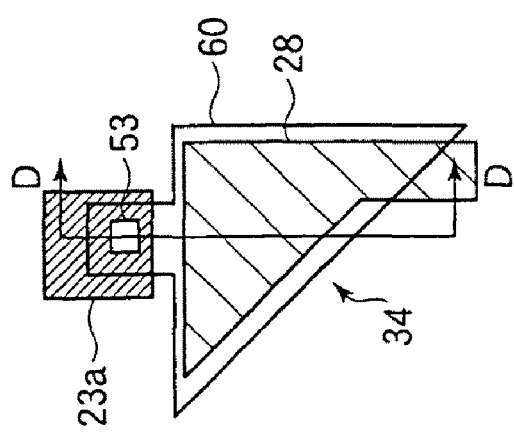
FIG.8A
FIG.8B

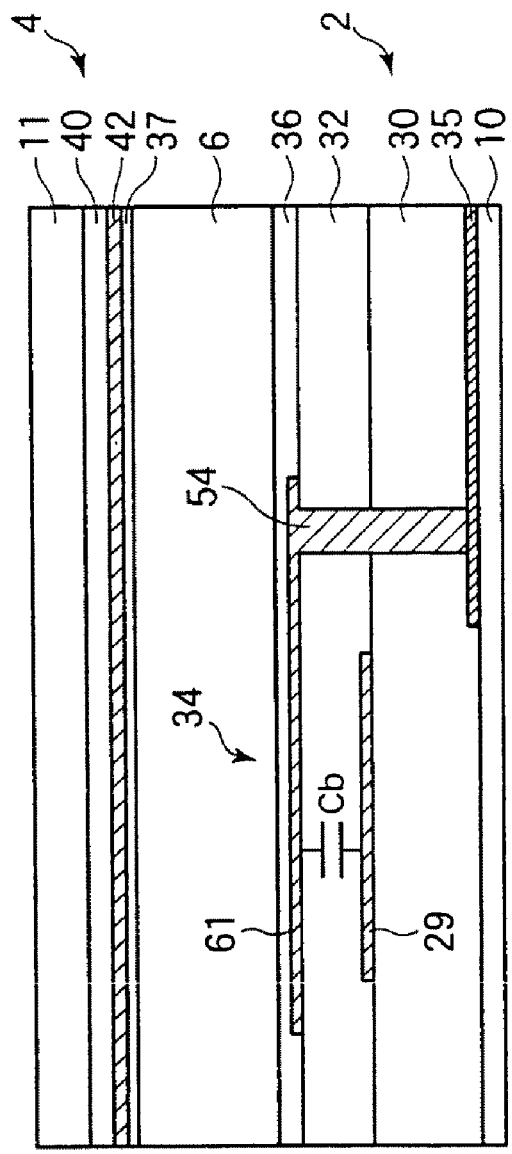
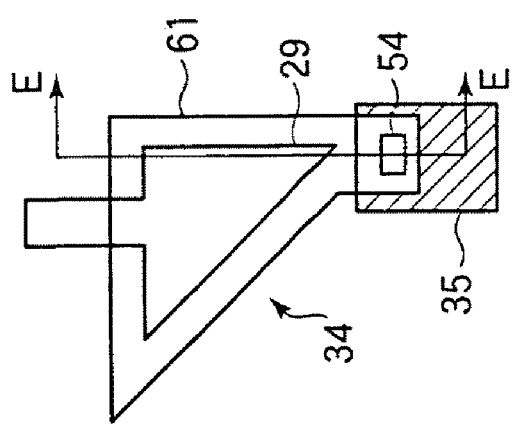
FIG.11B
FIG.11A

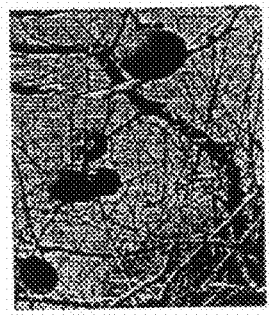
FIG. 21A
FIG. 21B
FIG. 22A
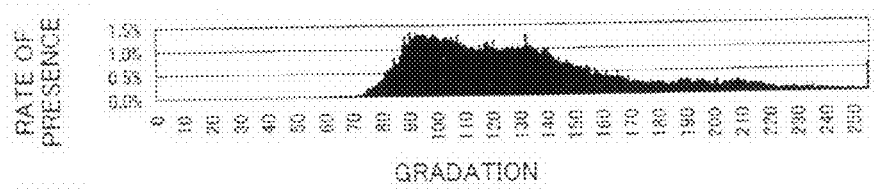
FIG. 22B
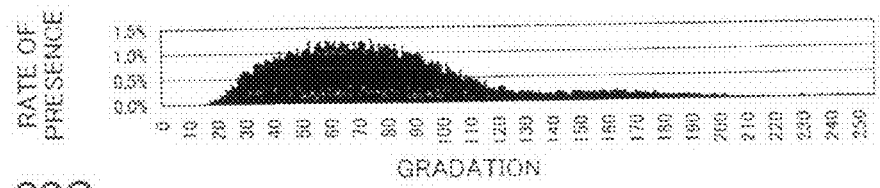
FIG. 22C
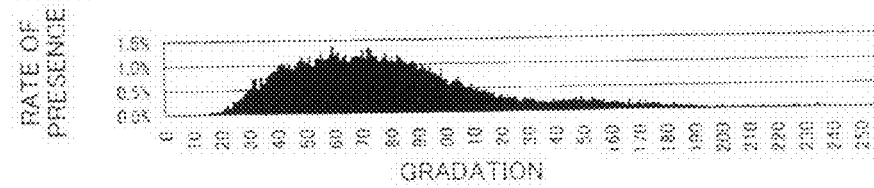

LIQUID CRYSTAL DISPLAY DEVICE

This application is a Divisional of application Ser. No. 11/390,465, filed Mar. 28, 2006, now U.S. Pat. No. 7,834,949 the entire content of which is hereby incorporated herein by reference in this application.

BACKGROUND OF THE INVENTION

1. Field of the Invention

The present invention relates to a liquid crystal display device used as, for example, a display unit of an electronic apparatus.

2. Description of the Related Art

In recent years, liquid crystal display devices have come to be used for TV receivers, monitor devices of personal computers, etc. In these purposes, liquid crystal display devices are required to have a good viewing angle characteristic that the display screen is viewable from all directions. FIG. 20 is a graph showing transmittance vs. application voltage characteristics (T-V characteristics) of a VA (vertically aligned)-mode liquid crystal display device. The horizontal axis represents the voltage (V) applied to the liquid crystal layer and the vertical axis represents the light transmittance. Line A is a T-V characteristic obtained in the direction perpendicular to the display screen (hereinafter referred to as "front direction"), and line B is a T-V characteristic obtained in a direction having an azimuth angle of 90° and a polar angle of 60° with respect to the display screen (hereinafter referred to as "slant direction"). The azimuth angle is measured counterclockwise from the rightward direction of the display screen and the polar angle is measured from the perpendicular to the display screen at the center.

As shown in FIG. 20, distortion exists in transmittance (luminance) variations in a region enclosed by circle C and its neighborhood. For example, whereas the transmittance in the slant direction is higher than that in the front direction at a relatively low gradation level (application voltage: about 2.5 V), the transmittance in the slant direction is lower than that in the front direction at a relatively high gradation level (application voltage: about 4.5 V). As a result, when the display screen is viewed from slant direction, luminance differences in an effective drive voltage range are small. This phenomenon is most remarkable in color variations.

FIGS. 21A and 21B show a difference in visual recognition between images displayed on the display screen. FIG. 21A shows an image as viewed from the front direction and FIG. 21B shows an image as viewed from the slant direction. As seen from FIGS. 21A and 21B, the image looks more whitish when viewed from the slant direction than when viewed from the front direction.

FIGS. 22A to 22C are gradation histograms of the three primary colors of red (R), green (G), and blue (B) of a reddish image, respectively. FIG. 22A is the gradation histogram of R, FIG. 22B is the gradation histogram of G, and FIG. 22C is the gradation histogram of B. The horizontal axes of FIGS. 22A to 22C represent the gradation (256 gradations (0 to 255)) and their vertical axes represent the percentage of presence. As seen from FIGS. 22A to 22C, in this image, relatively high gradation levels of R exist at high percentages and relatively low gradation levels of G and B exist at high percentages. If this kind of image is displayed on the display screen of a VA-mode liquid crystal display device and viewed from the slant direction, R (high gradation levels) looks relatively darker and G and B (low gradation levels) look relatively brighter. Since the luminance differences between the three primary colors, decrease, the image looks whitish as a whole.

The above phenomenon occurs in a similar manner also in liquid crystal display devices of the TN (twisted nematic) mode, which is an older drive mode. JP-A-2-12 (Reference 1), U.S. Pat. No. 4,840,460 (Reference 2), and Japanese Patent No. 3,076,938 (Reference 3) disclose techniques for suppressing the above phenomenon in TN-mode liquid crystal display devices. FIG. 23 shows the configuration of one pixel of a basic liquid crystal display device according to these prior art references. FIG. 24 is a sectional view of the liquid crystal display device taken along line X-X in FIG. 23. FIG. 25 shows an equivalent circuit of one pixel of the liquid crystal display device. As shown in FIGS. 23 to 25, the liquid crystal display device has a thin-film transistor (TFT) substrate 102, a counter substrate 104, and a liquid crystal layer 106 which is sealed between the two substrates 102 and 104.

The TFT substrate 102 has plural gate bus lines 112 formed on a glass substrate 110 and plural drain bus lines 114 formed so as to cross the gate bus lines 112 with an insulating film 130 interposed in between. A TFT 120 which is formed as a switching element for each pixel is disposed close to the crossing point of each set of a gate bus line 112 and a drain bus line 114. Part of the gate bus line 112 associated with the TFT 120 functions as a gate electrode of the TFT 120, and a drain electrode 121 of the TFT 120 is electrically connected to the associated drain bus line 114. A storage capacitance bus line 118 is formed so as to traverse a pixel region defined by the gate bus lines 112 and the drain bus lines 114 and to extend parallel with the gate bus lines 112. A storage capacitance electrode 119 which is provided for each pixel is formed above the storage capacitance bus line 118 with the insulating film 130 interposed in between. The storage capacitance electrode 119 is electrically connected to a source electrode 122 of the TFT 120 via a control capacitance electrode 125. A storage capacitor Cs is formed by the storage capacitance bus line 118, the storage capacitance electrode 119, and that part of the insulating film 130 which is interposed between them.

The pixel region which is defined by the gate bus lines 112 and the drain bus lines 114 is divided into sub-pixels A and B. A pixel electrode 116 is formed in the sub-pixel A, and a pixel electrode 117 which is separated from the pixel electrode 116 is formed in the sub-pixel B. The pixel electrode 116 is electrically connected to the storage capacitance electrode 119 and the source electrode 122 of the TFT 120 via a contact hole 124. On the other hand, the pixel electrode 117 is in an electrically floating state. The pixel electrode 117 has a region that coextends with part of the control capacitance electrode 125 with a protective film 132 interposed in between. In this region, a control capacitor Cc is formed by the pixel electrode 117, the control capacitance electrode 125, and that part of the protective film 132 which is interposed between them. The pixel electrode 117 is connected indirectly to the source electrode 122 via the control capacitor Cc (capacitive coupling).

The counter substrate 104 has a color filter (CF) resin layer 140 formed on a glass substrate 111 and a common electrode 142 formed on the CF resin layer 140. A liquid crystal capacitor Clc1 is formed in the sub-pixel A by the pixel electrode 116, the common electrode 142, and that part of the liquid crystal layer 106 which is interposed between the electrodes 116 and 142, and a liquid crystal capacitor Clc2 is formed in the sub-pixel B by the pixel electrode 117, the common electrode 142 and that part of the liquid crystal layer 106 which is interposed between the electrodes 117 and 142. Alignment films 136 and 137 are formed at the interfaces between the TFT substrate 102 and the liquid crystal layer 106 and between the counter substrate 104 and the liquid crystal layer 106, respectively.

Now assume that the TFT 120 has been turned on, whereby a voltage is applied to the pixel electrode 116 in the sub-pixel A, that is, a voltage Vpx1 develops across that part of the liquid crystal layer 106 which is located in the sub-pixel A. Since the voltage Vpx1 is divided according to the capacitance ratio of the liquid crystal capacitor Clc2 and the control capacitor Cc, a voltage that is applied to the pixel electrode 117 in the sub-pixel B is different from the voltage applied to the pixel electrode 116. A voltage Vpx2 that develops across that part of the liquid crystal layer 106 which is located in the sub-pixel B is given by $$Vpx2=(Cc/(Clc2+Cc))\times Vpx1.$$

It is ideal that the voltage ratio Vpx2/Vpx1 (=Cc/(Clc2+Cc)), which is a design item that should be set according to intended display characteristics of an actual liquid crystal display device, be set approximately at 0.6 to 0.8.

Where as described above each pixel has the sub-pixels A and B in which different voltages develop across the corresponding portions of the liquid crystal layer 106, the distortion in the T-V characteristic as shown in FIG. 20 is shared between the sub-pixels A and B. Therefore, the phenomenon that an image looks whitish when viewed from a slant direction is suppressed and the viewing angle characteristic is improved. The above technique will be referred to below as "capacitive coupling HT (halftone/gray scale) technique."

Although in References 1 to 3 the above technique is discussed for TN-mode liquid crystal display devices, its effect is enhanced if the above technique is applied to a liquid crystal display device of the VA mode which has become the mainstream mode in recent years in place of the TN mode.

FIGS. 26A to 26D illustrate a burn-in phenomenon occurring in a conventional liquid crystal display device that employs the capacitive coupling HT technique. FIG. 26A shows a black-and-white checkered pattern that was displayed on the screen in a burn-in test. In the burn-in test, a halftone image ($^{32}/_{64}$ gradations) of the same gradation level was displayed over the entire screen immediately after the checkered pattern of FIG. 26A had been displayed continuously for a prescribed time (e.g., 48 hours) and it was checked whether a checkered pattern was seen. If a checkered pattern was seen, the luminance of the screen was measured along one direction of the checkered pattern and a burn-in factor was calculated. The burn-in factor is defined as b/a where a is luminance of low-luminance regions of a visually recognized checkered pattern and a+b(>a) is luminance of high-luminance regions.

FIG. 26B shows a state of the screen on which a halftone image was displayed in a liquid crystal display device that did not employ the capacitive coupling HT technique. FIG. 26C shows a state of the screen on which a halftone image was displayed in a conventional liquid crystal display device that employed the capacitive coupling HT technique. As shown in FIG. 26B, a checkered pattern was hardly seen when displaying the halftone image in the liquid crystal display device that did not employ the capacitive coupling HT technique. When the luminance was measured along line Y-Y' in FIG. 26B, a luminance distribution represented by line c in FIG. 26D was obtained. The burn-in factor was as small as 0% to 5%. In contrast, a checkered pattern as shown in FIG. 26C was seen in the liquid crystal display device that employed the capacitive coupling HT technique. When the luminance was measured along line Y-Y' in FIG. 26C, a luminance distribution represented by line d in FIG. 26D was obtained. The burn-in factor was 10% or more. As is understood from this test, whereas almost no burn-in occurs in a liquid crystal display device that does not employ the capacitive coupling HT technique, a relatively high degree of burn-in occurs in a liquid crystal display device that employs the capacitive coupling HT technique.

A burn-in distribution in each pixel and other items of liquid crystal display devices where a burn-in phenomenon occurred were evaluated and an analysis was done. And it was found that the burn-in phenomenon occurs in the sub-pixels B where the pixel electrode 117 is formed which is in an electrically floating state. The pixel electrode 117 is connected to the control capacitance electrode 125 via a silicon nitride film (SiN film) or the like having a very high electrical resistance, and is connected to the common electrode 142 via the liquid crystal layer 106 also having a very high electrical resistance. Therefore, the charge accumulated in the pixel electrode 117 is not released easily. On the other hand, a prescribed voltage is written frame-by-frame to the pixel electrode 116 of the sub-pixel A which is electrically connected to the source electrode 122 of the TFT 120, and the pixel electrode 116 is connected to the drain bus line 114 via the operation semiconductor layer of the TFT 120 which is much lower in electrical resistance than the SiN film and the liquid crystal layer 106. Therefore, there does not occur an event that the charge accumulated in the pixel electrode 116 is not released.

As described above, conventional liquid crystal display devices that employ the capacitive coupling HT technique have a problem that they cannot provide superior display characteristics because of occurrence of the burn-in phenomenon though their viewing angle characteristic is improved.

JP-A-2004-78157 and JP-A-2003-255303 are other prior art references relating to the invention.

SUMMARY OF THE INVENTION

An object of the present invention is therefore to provide a liquid crystal display device capable of providing superior display characteristics.

The above object is attained by a liquid crystal display device comprising a pair of substrates opposed to each other; a liquid crystal layer sealed between the substrates; a plurality of gate bus lines formed on one of the substrates so as to be parallel with each other; a plurality of drain bus lines formed so as to cross the gate bus lines with an insulating film interposed in between; a plurality of storage capacitance bus lines formed parallel with the gate bus lines; first and second transistors each having a gate electrode electrically connected to an nth gate bus line and a drain electrode electrically connected to one of the drain bus lines; a first pixel electrode electrically connected to a source electrode of the first transistor; a second pixel electrode which is electrically connected to a source electrode of the second transistor and is separated from the first pixel electrode; a pixel region having at least a first sub-pixel in which the first pixel electrode is formed and a second sub-pixel in which the second pixel electrode is formed; a third transistor having a gate electrode electrically connected to an (n+1)th gate bus line, a source electrode connected or coupled to the second pixel electrode, and a drain electrode connected or coupled to one of the storage capacitance bus lines; and a buffer capacitance portion which establishes capacitive coupling between the drain electrode of the third transistor and the storage capacitance bus line or between the source electrode of the third transistor and the second pixel electrode.

The invention can realize a liquid crystal display device capable of providing superior display characteristics.

BRIEF DESCRIPTION OF THE DRAWINGS

FIGS. 8A and 8B show a liquid crystal display device according to a first principle of the embodiment of the invention;

FIGS. 11A and 11B show a liquid crystal display device according to a fourth principle of the embodiment of the invention;

FIGS. 21A and 21B show a difference in visual recognition between images displayed on the display screen;

FIGS. 22A to 22C are gradation histograms of R, G, and B of a reddish image, respectively;

DESCRIPTION OF THE PREFERRED EMBODIMENTS

Figure 1:
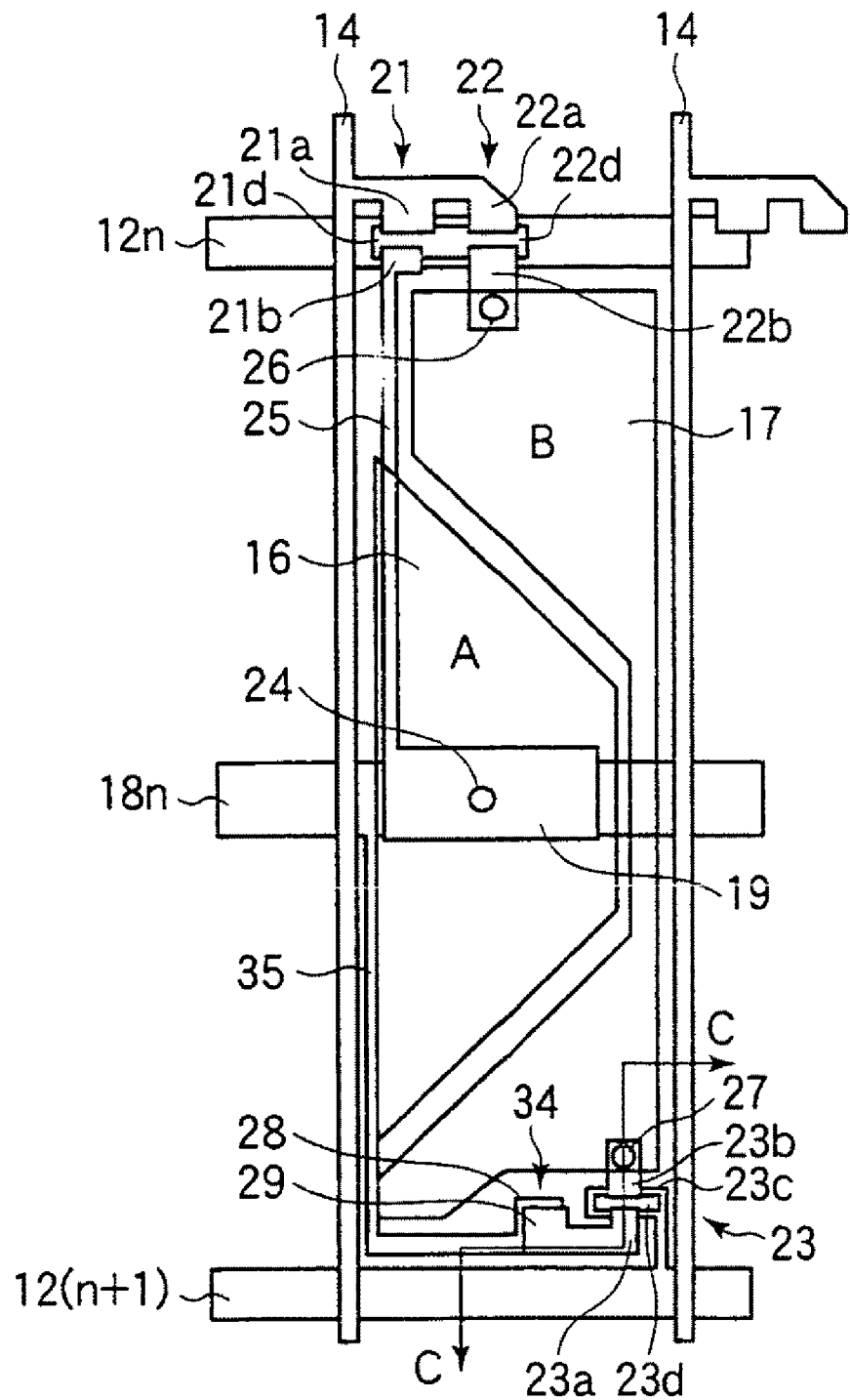
FIG. 1 shows the configuration of one pixel of a liquid crystal display device as a base of an embodiment of the present invention.
Figure 2:
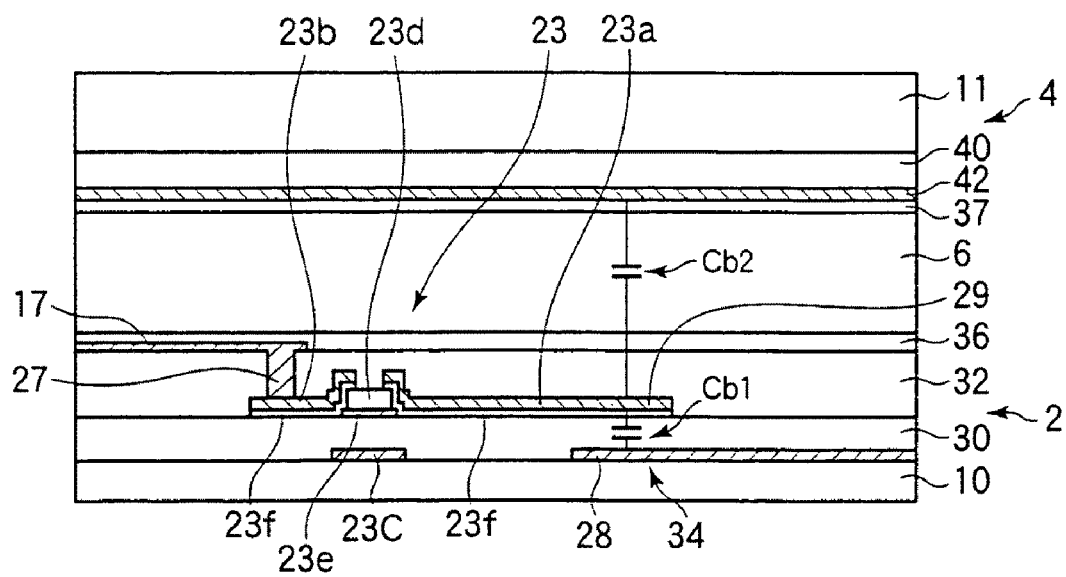
FIG. 2 is a sectional view of the liquid crystal display device as a base of an embodiment of the present invention.
Figure 3:
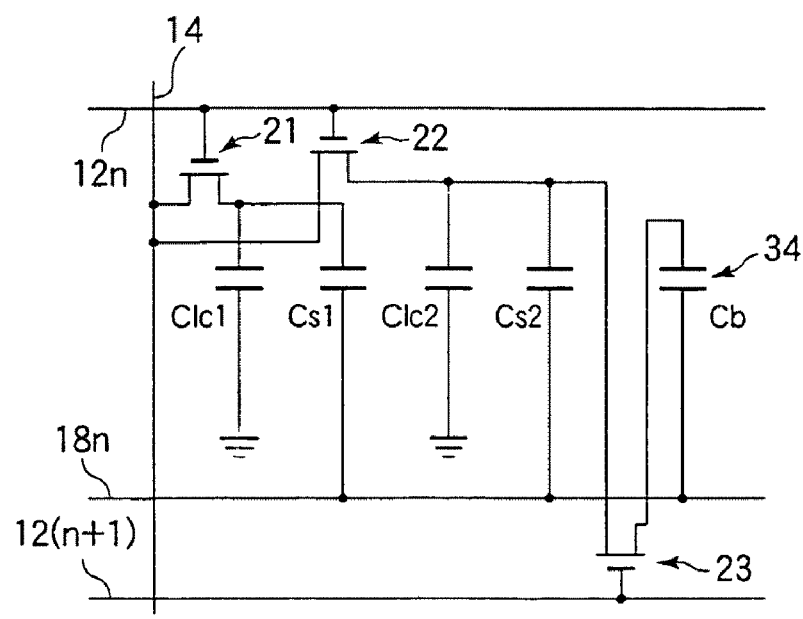
FIG. 3 shows an equivalent circuit of one pixel of the liquid crystal display device as a base of an embodiment of the present invention.

A liquid crystal display device according to an embodiment of the present invention will be hereinafter described with reference to FIGS. 1 to 19. First, a liquid crystal display device that is proposed in Japanese Patent Application No. 2004-323626 of the present assignee will be described as a base of this embodiment. FIG. 1 shows the configuration of one pixel of the liquid crystal display device proposed in the above patent application. FIG. 2 is a sectional view of the liquid crystal display device taken along line C-C in FIG. 1. FIG. 3 shows an equivalent circuit of one pixel of the liquid crystal display device. As shown in FIGS. 1 to 3, the TFT substrate 2 has plural gate bus lines 12 which are formed on a glass substrate 10 and plural drain bus lines 14 which are formed so as to cross the gate bus lines 12 with an insulating film 30 (a dielectric film such as an SiN film) interposed in between. For example, the plural gate bus lines 12 are scanned line-sequentially. FIGS. 1 to 3 show an nth gate bus line 12n which is scanned nthly and an (n+1)th gate bus line 12(n+1) which is scanned (n+1)thly. A first TFT 21 and a second TFT 22 which are formed for each pixel are disposed adjacent to each other close to the crossing point of each set of the gate bus line 12 and the drain bus line 14. Parts of the gate bus line 12n function as gate electrodes of the TFTs 21 and 22. For example, an integral operation semiconductor layer (not shown) of the TFTs 21 and 22 is formed on the gate bus line 12n with an insulating film 30 interposed in between. For example, an integral channel protective film 21d and 22d are formed on the operation semiconductor layer. The combination of a drain electrode 21a and an underlying n-type impurity semiconductor layer (not shown) and the combination of a source electrode 21b and an underlying n-type impurity semiconductor layer (not shown) are formed on the channel protective film 21d of the TFT 21 so as to be opposed to each other via a prescribed gap. The combination of a drain electrode 22a and an underlying n-type impurity semiconductor layer (not shown) and the combination of a source electrode 22b and an underlying n-type impurity semiconductor layer (not shown) are formed on the channel protective film 22d of the TFT 22 so as to be opposed to each other via a prescribed gap. The drain electrode 21a of the TFT 21 and the drain electrode 22a of the TFT 22 are electrically connected to the associated drain bus line 14. The source electrode 21b of the TFT 21 and the drain electrode 22b of the TFT 22 are separated from each other. The TFTs 21 and 22 are provided parallel with each other. A protective film 32 (a dielectric film such as an SiN film) is formed over the TFTs 21 and 22 over the entire substrate surface.

Storage capacitance bus lines 18 are formed so as to traverse the pixel regions defined by the gate bus lines 12 and the drain bus lines 14 and to extend parallel with the gate bus lines 12. FIGS. 1 and 3 show a storage capacitance bus line 18n which is disposed between the gate bus lines 12n and 12(n+1). A storage capacitance electrode 19 is formed above the storage capacitance bus line 18n with the insulating film 30 interposed in between (the storage capacitance electrode 19 are provided for the respective pixels). The storage capacitance electrode 19 is electrically connected to the source electrode 21b of the TFT 21 via a connection electrode 25. A first storage capacitor Cs1 is formed by the storage capacitance bus line 18n, the storage capacitance electrode 19, and that part of the insulating film 30 which is interposed between them.

The pixel region which is defined by the gate bus lines 12 and the drain bus lines 14 is divided into sub-pixels A and B.

As shown in FIG. 1, the sub-pixel A which has a trapezoidal shape, for example, is disposed at the center (in the top-bottom direction) of the pixel region close to its left-hand end line and the sub-pixel B is disposed in portions of the pixel regions excluding the region of the sub-pixel A, that is, disposed in a top portion, a bottom portion, and a portion that is located at the center (in the top-bottom direction) of the pixel region close to its right-hand end line. For example, each of the sub-pixels A and B is approximately symmetrical with respect to the storage capacitance bus line 18n. A pixel electrode 16 is formed in the sub-pixel A and a pixel electrode 17 which is separated from the pixel electrode 16 is formed in the sub-pixel B. Both of the pixel electrodes 16 and 17 are a transparent conductive film made of ITO or the like. To obtain a superior viewing angle characteristic, it is desirable that the ratio of the area of the sub-pixel B to that of the sub-pixels A be in a range of ½ to 4. The pixel electrode 16 is electrically connected to the storage capacitance electrode 19 and the source electrode 21b of the TFT 21 via a contact hole 24 which is formed through the protective film 32. The pixel electrode 17 is electrically connected to the source electrode 22b of the TFT 22 via a contact hole 26 which is formed through the protective film 32. The pixel electrode 17 has a region which coextends with part of the storage capacitance bus line 18n with the protective film 32 and the insulating film 30 interposed in between. In this region, a second storage capacitor Cs2 is formed by the storage capacitance bus line 18n, the pixel electrode 17, and those parts of the protective film 32 and the insulating film 30 which are interposed between them.

A third TFT 23 is disposed at a bottom position of each pixel region (see FIG. 1). A gate electrode 23c of the TFT 23 is electrically connected to a gate bus line 12(n+1) of the pixel of the next stage. An operation semiconductor layer 23e is formed over the gate electrode 23c via the insulating film 30. A channel protective film 23d is formed on the operation semiconductor layer 23e. The combination of a drain electrode 23a and an underlying n-type impurity semiconductor layer 23f and the combination of a source electrode 23b and an underlying n-type impurity semiconductor layer 23f are formed on the channel protective film 23d so as to be opposed to each other via a prescribed gap. The source electrode 23b is electrically connected to the pixel electrode 17 via a contact hole 27. A buffer capacitance electrode 28 which is electrically connected to the storage capacitance bus line 18n via a connection electrode 35 is disposed close to the TFT 23. A buffer capacitance electrode 29 is formed over the buffer capacitance electrode 28 with the insulating film 30 interposed in between. The buffer capacitance electrode 29 is electrically connected to the drain electrode 23a. The buffer capacitance electrodes 28 and 29 which are opposed to each other and that part of the insulating film 30 which is interposed between them constitute a buffer capacitance portion 34. A buffer capacitor Cb (Cb1 in FIG. 2) is formed in the buffer capacitance portion 34. The drain electrode 23a of the TFT 23 and the storage capacitance bus line 18n are connected to each other indirectly via the buffer capacitor Cb (capacitive coupling). As described above, the liquid crystal display device shown in FIGS. 1 to 3 is provided with the three TFTs 21, 22, and 23 for each pixel. This type of structure of a liquid crystal display device will also be referred to below as "3-TFT halftone structure."

A counter electrode 4 has a CF resin layer 40 formed on a glass substrate 11 and a common electrode 42 which is formed on the CF resin layer 40 and kept at the same potential as the storage capacitance bus lines 18. A liquid crystal having negative dielectric anisotropy, for example, is sealed between the TFT substrate 2 and the counter substrate 4, whereby a liquid crystal layer 6 is formed. A liquid crystal capacitor Clc1 is formed by the pixel electrode 16 of the sub-pixels A, the common electrode 42, and that part of the liquid crystal layer 6 which is interposed between them, and a liquid crystal capacitor Clc2 is formed by the pixel electrode 17 of the sub-pixel B, the common electrode 42, and that part of the liquid crystal layer 6 which is interposed between them. An alignment film (vertical alignment film) 36 is formed at the interface between the TFT substrate 2 and the liquid crystal layer 6 and an alignment film 37 is formed at the interface between the counter substrate 4 and the liquid crystal layer 6, whereby the liquid crystal molecules of the liquid crystal layer 6 are oriented almost perpendicularly to the substrate surfaces when no voltages are applied.

The reason why a relatively high degree of burn-in occurs in the conventional liquid crystal display device employing the capacitive coupling HT technique is that the charge accumulated in the pixel electrode of the sub-pixel B is not released easily because the pixel electrode is connected to each of the control capacitance electrode and the common electrode via a very high electrical resistance. In contrast, in the liquid crystal display device having the 3-TFT halftone structure shown in FIGS. 1 to 3, the pixel electrode 17 of the sub-pixel B is connected to the drain bus line 14 via the TFT 22. The electrical resistance of the operation semiconductor layer of the TFT 22 is much lower than that of each of the insulating film 30, the protective film 32, etc. even in an off state. Therefore, the charge accumulated in the pixel electrode 17 is released easily. As a result, in this liquid crystal display device, a high degree of burn-in does not occur though the halftone technique, which realizes a wide viewing angle, is employed.

Figure 4:
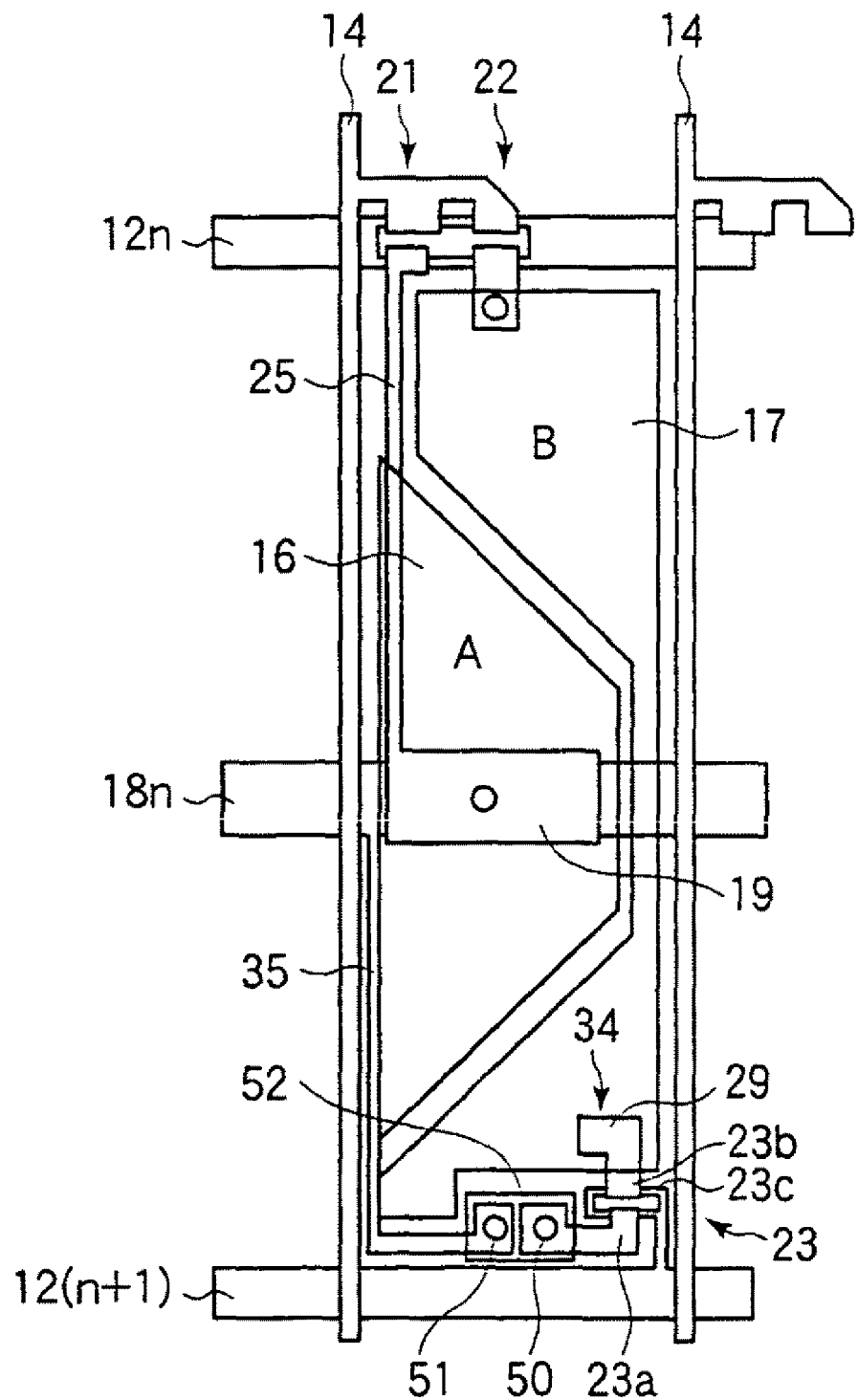
FIG. 4 shows the configuration of one pixel of another liquid crystal display device as a base of the embodiment of the invention.
Figure 5:
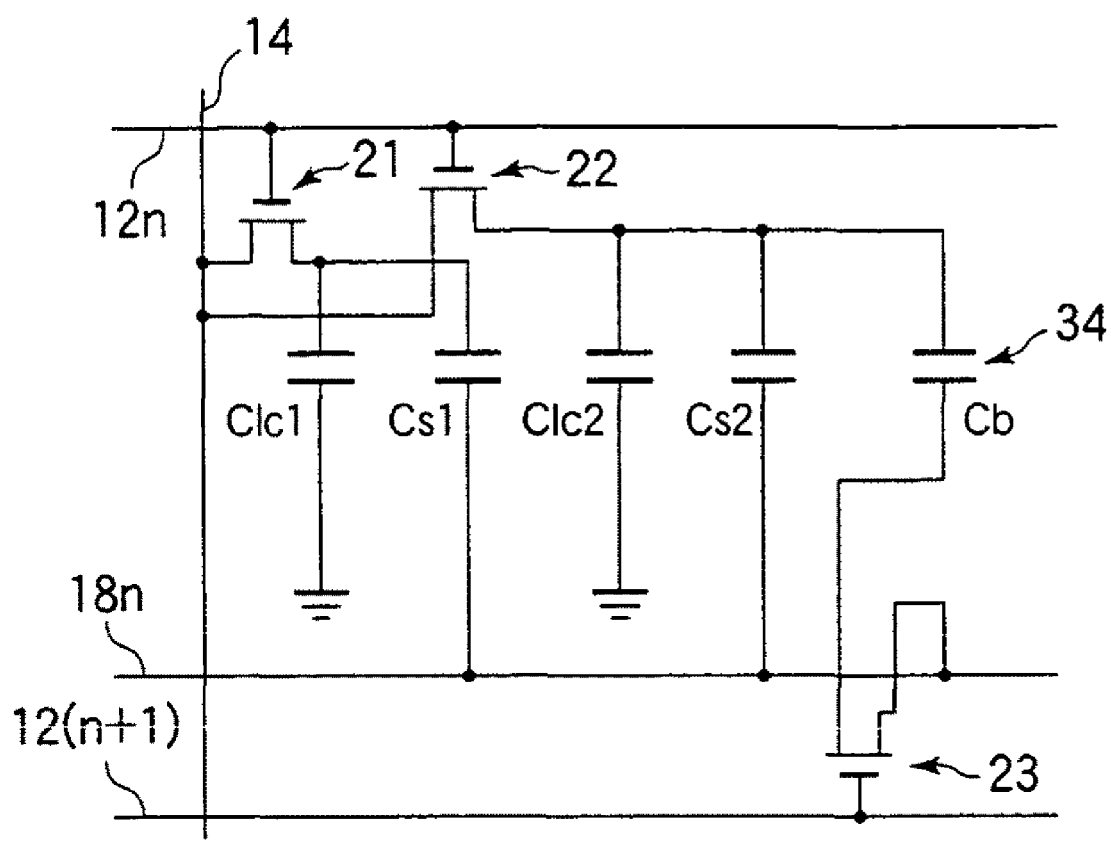
FIG. 5 shows an equivalent circuit of one pixel of the liquid crystal display device as a base of an embodiment of the present invention.

FIG. 4 shows the configuration of one pixel of another liquid crystal display device having the 3-TFT halftone structure proposed in the above patent application. FIG. 5 shows an equivalent circuit of one pixel of the liquid crystal display device. As shown in FIGS. 4 and 5, a source electrode 23b of a third TFT 23 is electrically connected to a buffer capacitance electrode 29. The buffer capacitance electrode 29 coextends with part of the pixel electrode 17 of the sub-pixel B. This part of the pixel electrode 17 functions as the other electrode of a buffer capacitance portion 34. That is, the buffer capacitance portion 34 is formed by the buffer capacitance electrode 29, the pixel electrode 17, and that part of the protective film 32 which is interposed between them. A buffer capacitor Cb is formed in the buffer capacitance portion 34. An alternative structure is possible in which a buffer capacitance electrode electrically connected to the pixel electrode 17 is provided separately and this buffer capacitance electrode overlaps with the buffer capacitance electrode 29 with a dielectric layer interposed in between. In this case, a buffer capacitor Cb is formed by the separate buffer capacitance electrode, the buffer capacitance electrode 29, and that part of the dielectric layer which is interposed between them. The pixel electrode 17 and the source electrode 23b of the TFT 23 are connected to each other indirectly via the buffer capacitor Cb (capacitive coupling).

A drain electrode 23a of the TFT 23 is electrically connected to a link electrode 52 via a contact hole 50 which is formed through the protective film 32. The link electrode 52 is formed in the same layer as the pixel electrodes 16 and 17 are. The link electrode 52 is electrically connected to the connection electrode 35 and the storage capacitance bus line 18n via a contact hole 51 which is formed through the protective film 32 and the insulating film 30. That is, the drain electrode 23a of the TFT 23 is electrically connected to the storage capacitance bus line 18n.

The liquid crystal display device of FIGS. 4 and 5 can provide the same advantages as that of FIGS. 1 to 3. However, in the liquid crystal display device of FIGS. 4 and 5, linking using the link electrode 52 is necessary for electrical connection between the drain electrode 23a and the connection electrode 35. This may results in a small reduction in the aperture ratio of each pixel.

Figure 6:
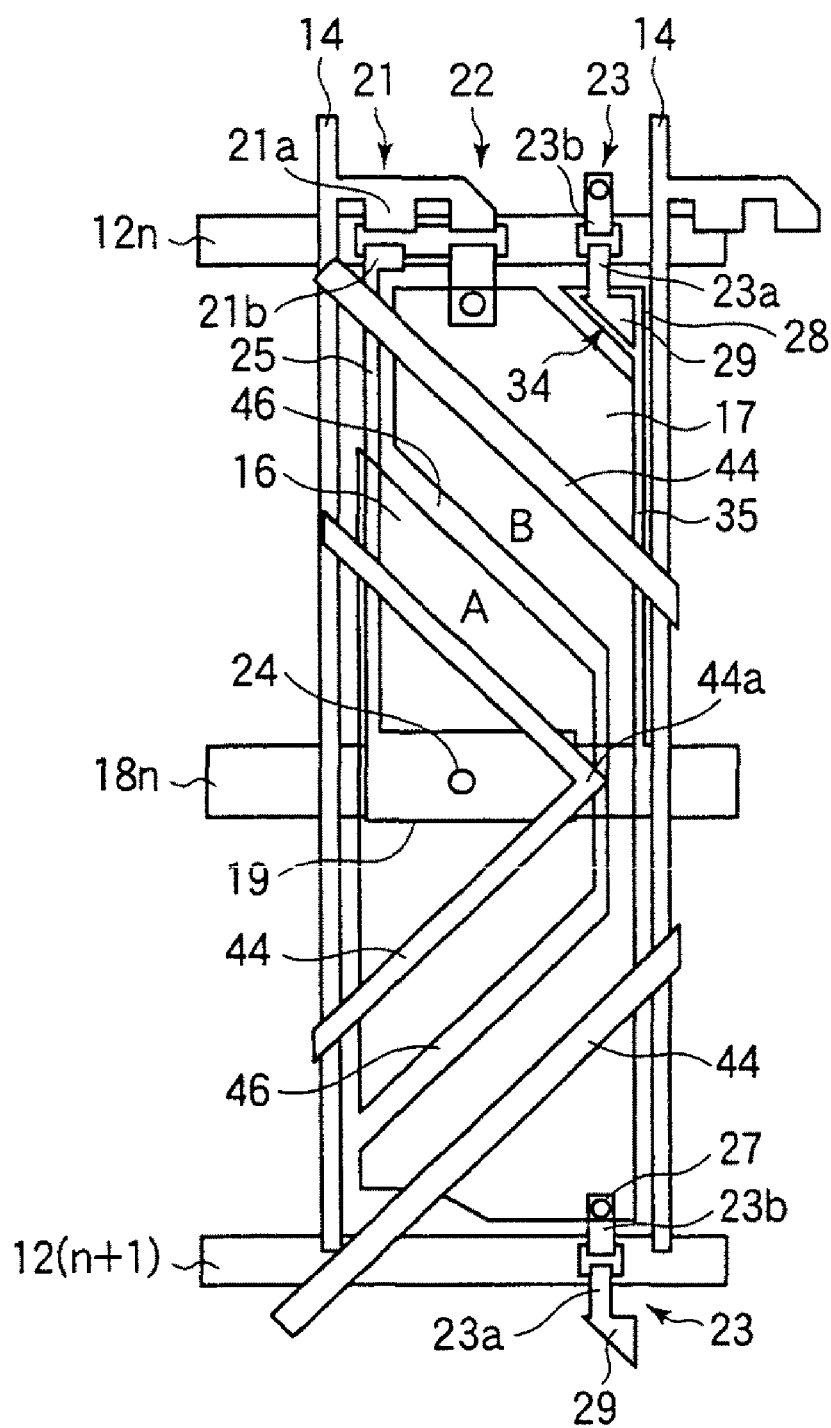
FIG. 6 shows the configuration of one pixel of a further liquid crystal display device as a base of the embodiment of the invention.

FIG. 6 shows the configuration of one pixel of a further liquid crystal display device having the 3-TFT halftone structure proposed in the above patent application. The liquid crystal display device of FIGS. 1 to 3 may suffer a luminance reduction due to a reduction in the aperture ratio of each pixel. The greatest factor in reducing the aperture ratio is the TFT 23. In the liquid crystal display device of FIG. 6, the TFT 23 is disposed so as to stride the next-stage gate bus line 12(n+1). This measure reduces the area of the TFT 23 in the pixel region and thereby increases the aperture ratio.

However, where the TFT 23 is disposed so as to stride the next-stage gate bus line 12(n+1), one of the drain electrode 23a and the source electrode 23b is disposed in the adjacent, next-stage pixel region. Where, for example, the drain electrode 23a and the buffer capacitance portion 34 are disposed in the next-stage pixel region, a structure that a connection electrode 35 which connects a buffer capacitance electrode 28 to the storage capacitance bus line 18n also strides the gate bus line 12(n+1) is not desirable because it lowers the aperture ratio. In view of this, a structure is employed that a buffer capacitance electrode 28 is connected, via a connection electrode 35, to the storage capacitance bus line 18(n+1) which is disposed between the gate bus lines 12(n+1) and 12(n+2). Since all the storage capacitance bus lines 18 have the same potential, no problems occur even if the buffer capacitance electrode 28 is connected to the next-stage storage capacitance bus line 18(n+1).

Linear projections 44 which extend obliquely with respect to the end lines of the pixel region are formed on the counter substrate 4 with a photosensitive resin or the like. The linear projections 44 function as alignment restriction structures for restricting the alignment of the liquid crystal. Instead of the linear projections 44, slits may be formed in the common electrode 42 as alignment restriction structures. Linear slits 46 which separate the pixel electrodes 16 and 17 from each other extend parallel with the linear projections 44, that is, obliquely with respect to the end lines of the pixel region. The slits 46 also function as TFT-substrate-2-side alignment restriction structures.

Figure 23:
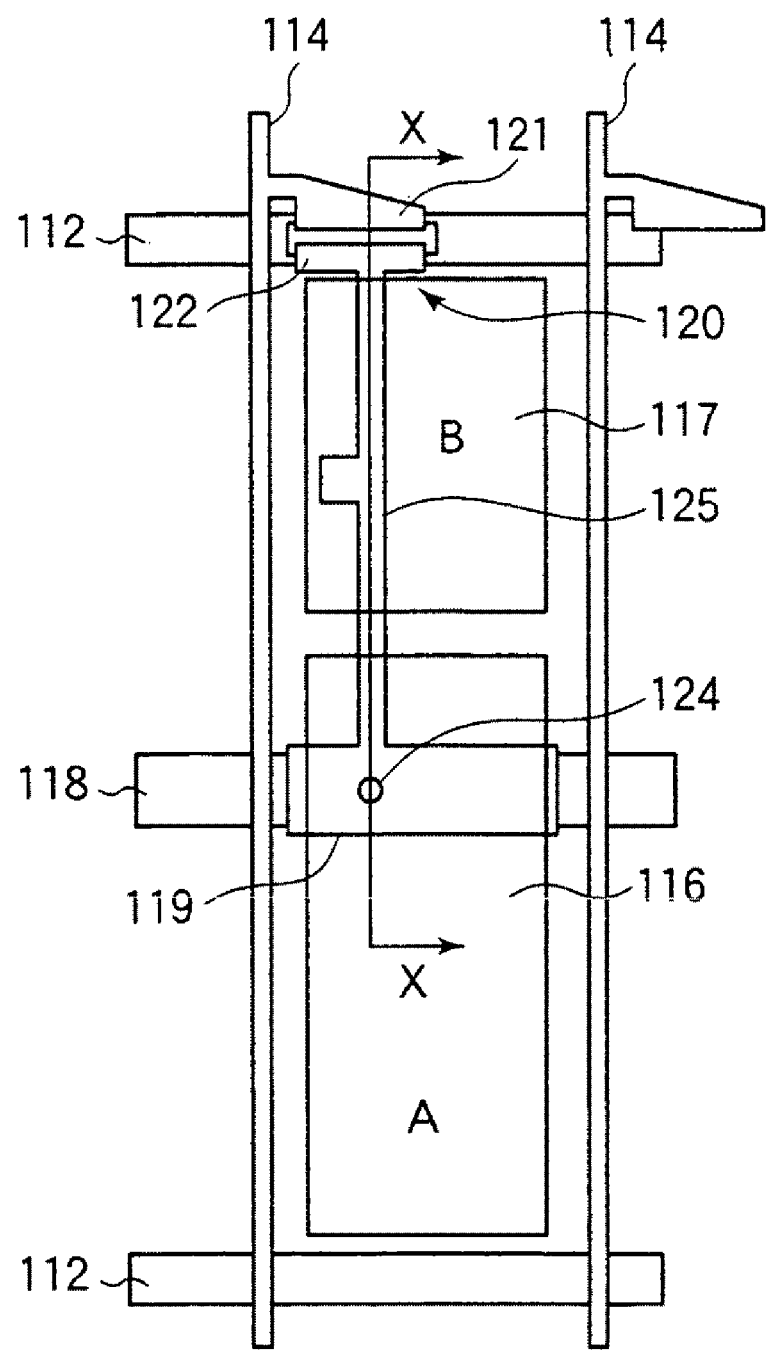
FIG. 23 shows the configuration of one pixel of a basic liquid crystal display device according to prior art references.
Figure 24:
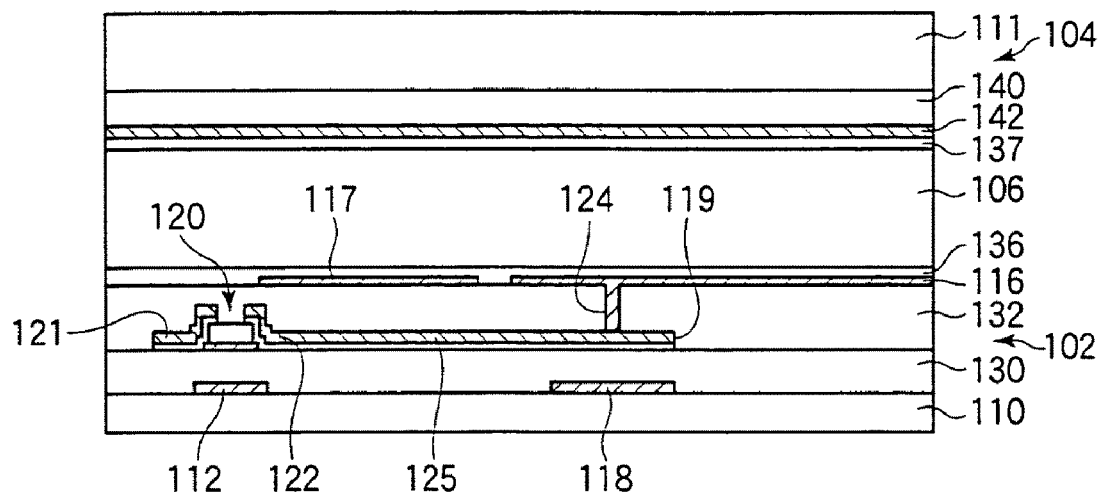
FIG. 24 is a sectional view of the basic liquid crystal display device according to prior art references.
Figure 25:
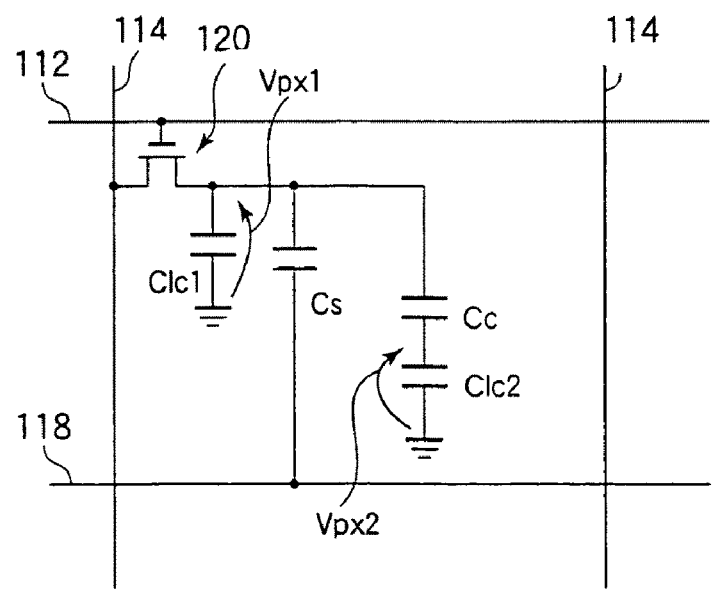
FIG. 25 shows an equivalent circuit of one pixel of the basic liquid crystal display device according to prior art references.
Figure 26A:
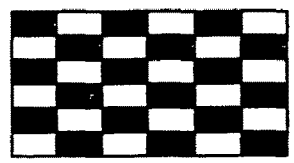
FIGS. 26A to 26D illustrate a burn-in phenomenon occurring in a conventional liquid crystal display device which employs the capacitive coupling HT technique.
Figure 26B:
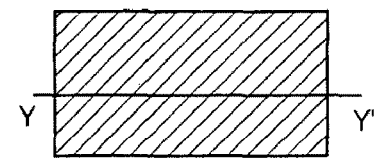
Figure 26C:
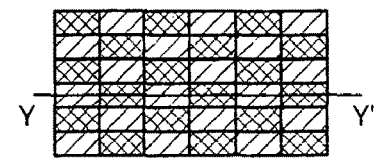
Figure 26D:
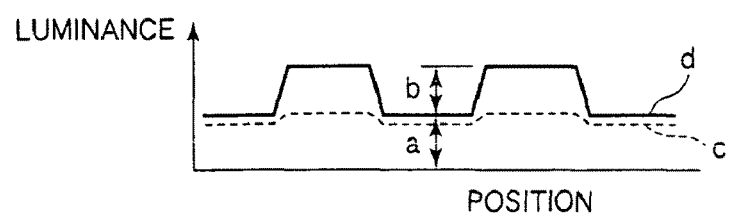

Now, problems that may occur in a liquid crystal display device having the 3-TFT halftone structure will be described. In the conventional liquid crystal display device of FIGS. 23 to 25 which employs the capacitive coupling HT method, the pixel electrodes 116 and 117 are given different potentials by utilizing the fact that a voltage that is applied when the TFT 120 is turned on is divided according to the capacitance ratio of the liquid crystal capacitor Clc2 and the control capacitance Cc. In contrast, in the liquid crystal display device having the 3-TFT halftone structure, when the gate bus line 12n is rendered in a selected state and the TFTs 21 and 22 are turned on, the same voltage is applied to the liquid crystal capacitors Clc1 and Clc2 of the respective sub-pixels A and B. Then, when the next-stage gate bus line 12(n+1) is rendered in a selected state and the third TFT is turned on, part of the charge accumulated in the liquid crystal capacitor Clc2 of the sub-pixel B moves to the buffer capacitor Cb, whereby the voltage across the liquid crystal capacitor Clc2 of the sub-pixel B decreases to cause a difference between the voltages of the liquid crystal capacitor Clc1 of the sub-pixel A and the liquid crystal capacitor Clc2 of the sub-pixel B. Therefore, the relationship between the capacitance ratio and the voltage ratio of the liquid crystal display device employing the capacitive coupling HT method is entirely different from that of the liquid crystal display device having the 3-TFT halftone structure.

Figure 7:
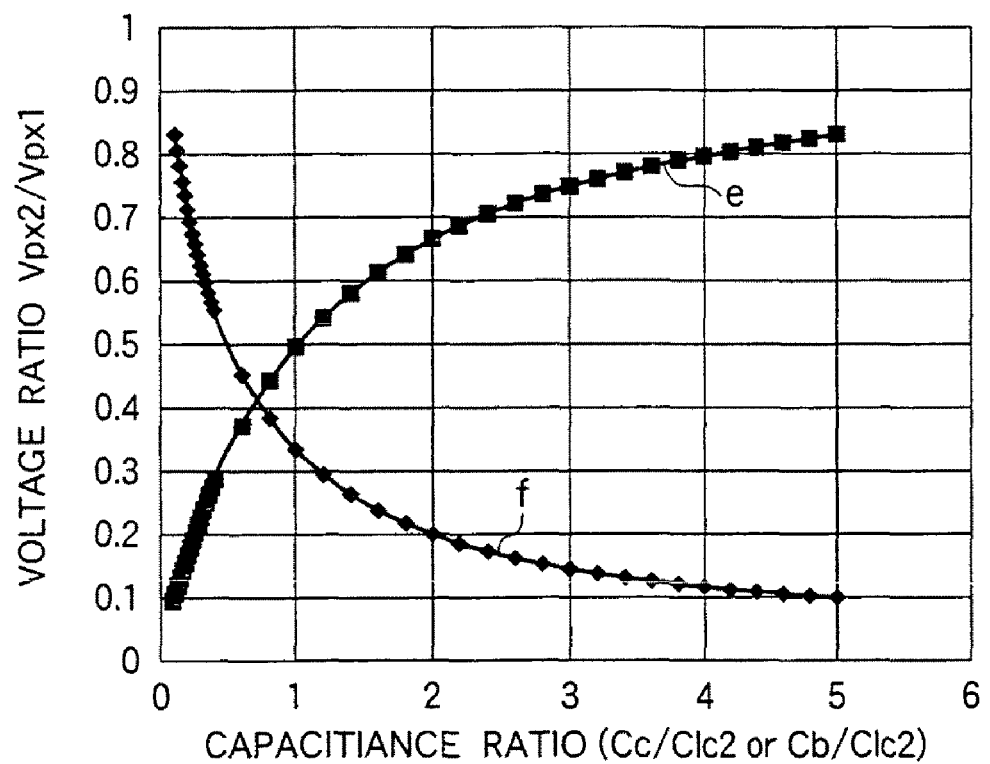
FIG. 7 is a graph showing relationships between the voltage ratio and the capacitance ratio in liquid crystal display devices.

FIG. 7 is a graph showing relationships between the voltage ratio and the capacitance ratio in the liquid crystal display device having the 3-TFT halftone structure and the liquid crystal display device employing the capacitive coupling HT method. The horizontal axis represents the capacitance ratio Cc/Clc2 of the control capacitance Cc to the liquid crystal capacitance Clc2 in the liquid crystal display device employing the capacitive coupling HT method or the capacitance ratio Cb/Clc2 of the buffer capacitance Cb to the liquid crystal capacitance Clc2 in the liquid crystal display device having the 3-TFT halftone structure. The vertical axis represents the voltage ratio Vpx2/Vpx1 of the voltage Vpx2 applied to that part of the liquid crystal layer 6 which is located in the sub-pixel B to the voltage Vpx1 applied to that part of the liquid crystal layer 6 which is located in the sub-pixel A. Curve e indicates a variation of the voltage ratio of the liquid crystal display device employing the capacitive coupling HT method, and curve f indicates a variation of the voltage ratio of the liquid crystal display device having the 3-TFT halftone structure. Because of variation of the permittivity of the liquid crystal, the liquid crystal capacitance Clc2 decreases (or increases) as the application voltage decreases (or increases). Therefore, a right-hand side of the graph in which the capacitance ratio Cc/Clc2 or Cb/Clc2 is large shows characteristics of a case that a low voltage is applied, and a left-hand side of the graph in which the capacitance ratio Cc/Clc2 or Cb/Clc2 is small shows characteristics of a case that a high voltage is applied.

Where each pixel is divided into the two sub-pixels A and B, an optimum voltage ratio Vpx2/Vpx1 is approximately in a range of 0.6 to 0.8. To obtain a voltage ratio Vpx2/Vpx1 of 0.7, for example, in the liquid crystal display device employing the capacitive coupling HT method, the capacitance ratio Cc/Clc2 needs to be set at about 2.5. That is, in the liquid crystal display device employing the capacitive coupling HT method, the control capacitance Cc needs to be set at a very large value that is about 2.5 times the liquid crystal capacitance Clc2. However, since the control capacitor Cc can be formed under the pixel electrode 117, a large decrease in the aperture ratio can be avoided by forming the control capacitance electrode 125 in such a manner that it overlaps with projections for alignment restriction etc. which do not contribute to the luminance. Further, since the control capacitance electrode 125 has a large pattern size, the voltage ratio does not vary to a large extent and visible display unevenness unlikely occurs even if a dimensional error occurs at the time of patterning.

In contrast, in the liquid crystal display device having the 3-TFT halftone structure, a voltage ratio Vpx2/Vpx1 of 0.7 can be obtained by providing a small buffer capacitance Cb that is only 20% of the liquid crystal capacitance Clc2 (Cb/Clc2=0.2). The insulating film 30 which serves as the dielectric layer of the buffer capacitor Cb is in the same layer as the gate insulating film that is located immediately above the gate electrodes f the TFTs. From the viewpoint of stabilizing the characteristics of the TFTs, it is difficult to change the thickness or permittivity ∈ of the insulating film 30 (gate insulating film). However, since the buffer capacitance Cb that is required in the liquid crystal display device having the 3-TFT halftone structure is relatively small, a sufficiently large buffer capacitance Cb can be obtained by using the buffer capacitance electrodes 28 and 29 having very small electrode areas as shown in FIGS. 1, 4, and 6. In a liquid crystal display device having relatively small pixels whose pitch (i.e., the interval between adjoining drain bus lines 14) is 100 μm or less, the small electrode areas are advantageous in enabling reduction in the aperture ratio. However, on the other hand, they mean a disadvantage that only a slight pattern dimensional error causes a large variation in the buffer capacitance Cb and hence likely results in visible display unevenness.

As shown in FIG. 2, the buffer capacitor Cb is not formed only by the capacitor Cb1 which is formed by the buffer capacitance electrodes 28 and 29 and that part of the insulating film 30 which is interposed between them. The capacitor Cb2 which is formed by the buffer capacitance electrode 29, the common electrode 42, and those parts of the liquid crystal layer 6, the protective film 32, etc. which are interposed between them is connected to the capacitor Cb1 in parallel (Cb=Cb1+Cb2). Whereas the capacitance Cb1 is almost constant, the capacitance Cb2 is not constant because it varies depending on the permittivity ∈ and the thickness (cell thickness) of the liquid crystal layer 6. Although the capacitance Cb2 is approximately 1/10 of the capacitance Cb1 because of the large difference between the thickness of the liquid crystal layer 6 and that of the insulating film 30, the buffer capacitance Cb varies with the capacitance Cb2. This results in a problem that visible display unevenness likely occurs.

On the other hand, in a liquid crystal display device for a TV receiver or the like having relatively large pixels whose pitch is larger than 150 μm, the buffer capacitance electrodes 28 and 29 have relatively large pattern sizes. Therefore, even if a dimensional variation occurs at the time of patterning, a variation in the buffer capacitance Cb is relatively small and hence visible display unevenness unlikely occurs. However, on the other hand, the buffer capacitance electrodes 28 and 29 have a non-negligible influence on the aperture ratio. Since the buffer capacitor Cb needs to be provided independently of the existing sub-pixels A and B, the aperture ratio cannot be increased by overlapping the buffer capacitor Cb with the sub-pixel A or B.

The problems of the liquid crystal display device having the 3-TFT halftone structure are as follows:

(1) In a liquid crystal display device having a small pixel size, it is difficult to form the buffer capacitor Cb stably and hence visible display unevenness likely occurs.

(2) In a liquid crystal display device having a large pixel size, the electrode areas of the buffer capacitance electrodes 28 and 29 are large and hence it is difficult to increase the aperture ratio of each pixel.

First to third principles of this embodiment for solving the above problem (1) will be described first. FIGS. 8A and 8B show the first principle of the embodiment. FIG. 8A shows a structure of a buffer capacitance portion 34 and its neighborhood, and FIG. 8B is a sectional view of a liquid crystal display device taken along line D-D in FIG. 8A. This liquid crystal display device is approximately the same in configuration as the liquid crystal display device of FIG. 6 except for the buffer capacitance portion 34. As shown in FIGS. 8A and 8B, a buffer capacitor Cb is formed by a buffer capacitance electrode 60 which is formed in the same layer as the pixel electrodes 16 and 17 and is electrically connected to the drain electrode 23a of the third TFT 23 via a contact hole 53, the buffer capacitance electrode 28 which is formed in the same layer as the storage capacitance bus line 18, coextends with part of the buffer capacitance electrode 60, and is electrically connected to the storage capacitance bus line 18, and those parts of the insulating film 30 and the protective film 32 which are interposed between them.

In this structure, the two layers, that is, the insulating film 30 and the protective film 32 serve as a dielectric layer of the buffer capacitor Cb. Therefore, the dielectric layer is thick, which lowers the capacitance per unit area of the buffer capacitor Cb. As a result, the electrode areas of the buffer capacitance electrodes 28 and 60 which form the buffer capacitor Cb are increased, which in turn increases allowances (margins) for dimensional errors. As described above, from the viewpoint of stabilizing the characteristics of the TFTs, it is difficult to change the thickness, for example, of the insulating film 30 (gate insulating film). In contrast, the thickness and permittivity of the protective film 32, which is disposed between the source electrodes of the TFTs and the pixel electrodes, can be adjusted relatively freely because it serves for interlayer insulation. This enables a design that the protective film 32 is made as thick as necessary to increase allowances for dimensional errors of the buffer capacitance electrodes 28 and 60.

Figure 9:
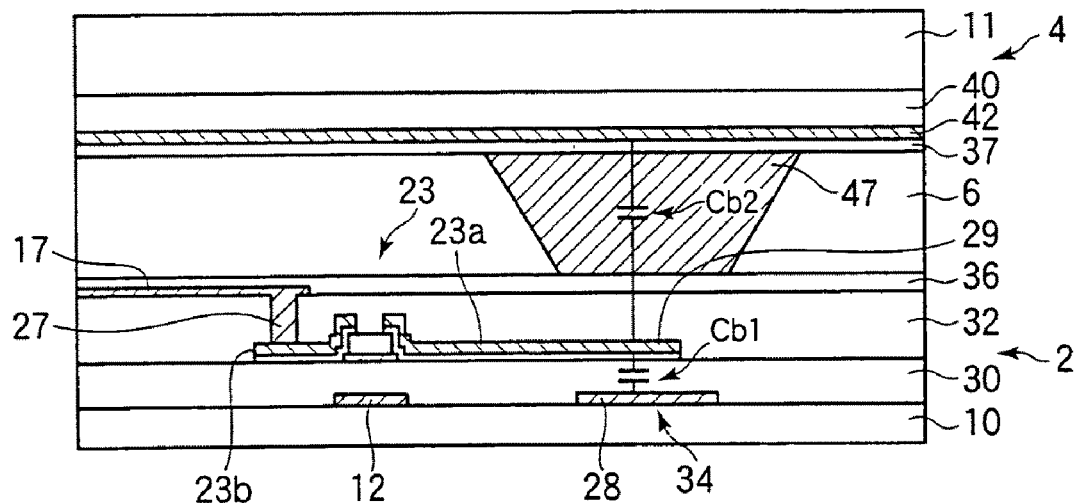
FIG. 9 shows a liquid crystal display device according to a second principle of the embodiment of the invention.

FIG. 9 shows the second principle of the embodiment. FIG. 9 is a sectional view showing a structure of the third TFT 23 and a buffer capacitance portion 34 and their neighborhood. As shown in FIG. 9, a resin layer having a prescribed height is provided in the region of formation of the buffer capacitance electrode 29 so as to remove the corresponding part of the liquid crystal layer 6. For example, it is desirable that the resin layer be a column-shaped spacer 47 for defining the cell thickness. A capacitor Cb2 is formed by the buffer capacitance electrode 29, that part of the common electrode 42 which is opposed to the buffer capacitance electrode 29, and the dielectric layer such as the column-shaped spacer 47.

In this structure, since that part of the liquid crystal layer 6 which is located in the buffer capacitance portion 34 is removed by the column-shaped spacer 47, the capacitance Cb2 does not vary and hence the buffer capacitance Cb (=Cb1+Cb2) is stable. Further, forming the column-shaped spacer 47 in the region of formation of the buffer capacitance electrodes 28 and 29 prevents reduction of the aperture ratio.

Figure 10:
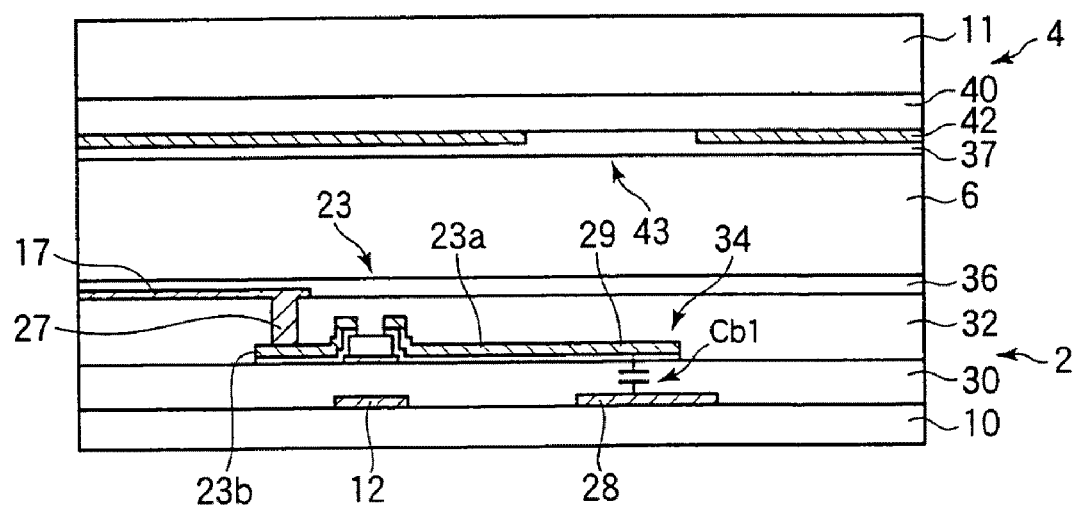
FIG. 10 shows a liquid crystal display device according to a third principle of the embodiment of the invention.

FIG. 10 shows the third principle of the embodiment. As shown in FIG. 10, an opening 43 is formed by removing part of the common electrode 42 in at least part of the region of formation of the buffer capacitance electrode 29. In this structure, since that part of the common electrode 42 which is opposed to the buffer capacitance electrode 29 is removed, almost no capacitance Cb2 is formed with involvement of the liquid crystal layer 6 and hence the buffer capacitance Cb (=Cb1) is stable.

Next, fourth and fifth principles of the embodiment for solving the above-mentioned problem (2) will be described. FIGS. 11A and 11B show the fourth principle of the embodiment. FIG. 11A shows a structure of a buffer capacitance portion 34 and its neighborhood, and FIG. 11B is a sectional view of a liquid crystal display device taken along line E-E in FIG. 11A. As shown in FIGS. 11A and 11B, a buffer capacitor Cb is formed by a buffer capacitance electrode 61 which is formed in the same layer as the pixel electrodes 16 and 17 and is electrically connected to the connection electrode 35 and the storage capacitance bus line 18 via a contact hole 54, the buffer capacitance electrode 29 which is formed in the same layer as the drain electrode 23a of the TFT 23, coextends with part of the buffer capacitance electrode 61, and is electrically connected to the drain electrode 23a of the TFT 23, and that part of the protective film 32 which is interposed between them.

In this structure, the protective film 32 serve as a dielectric layer of the buffer capacitor Cb. As described above, the thickness of the protective film 32 can be changed more easily than that of the insulating film 30. Therefore, the protective film 32 can be made thinner than the insulating film 30, whereby the buffer capacitance Cb can be increased even if the electrode areas of the buffer capacitance electrodes 29 and 61 are kept the same. Further, the electrode areas of the buffer capacitance electrodes 29 and 61 can be decreased if the buffer capacitance Cb is kept the same. Therefore, the aperture ratio of each pixel can be increase.

Figure 12:
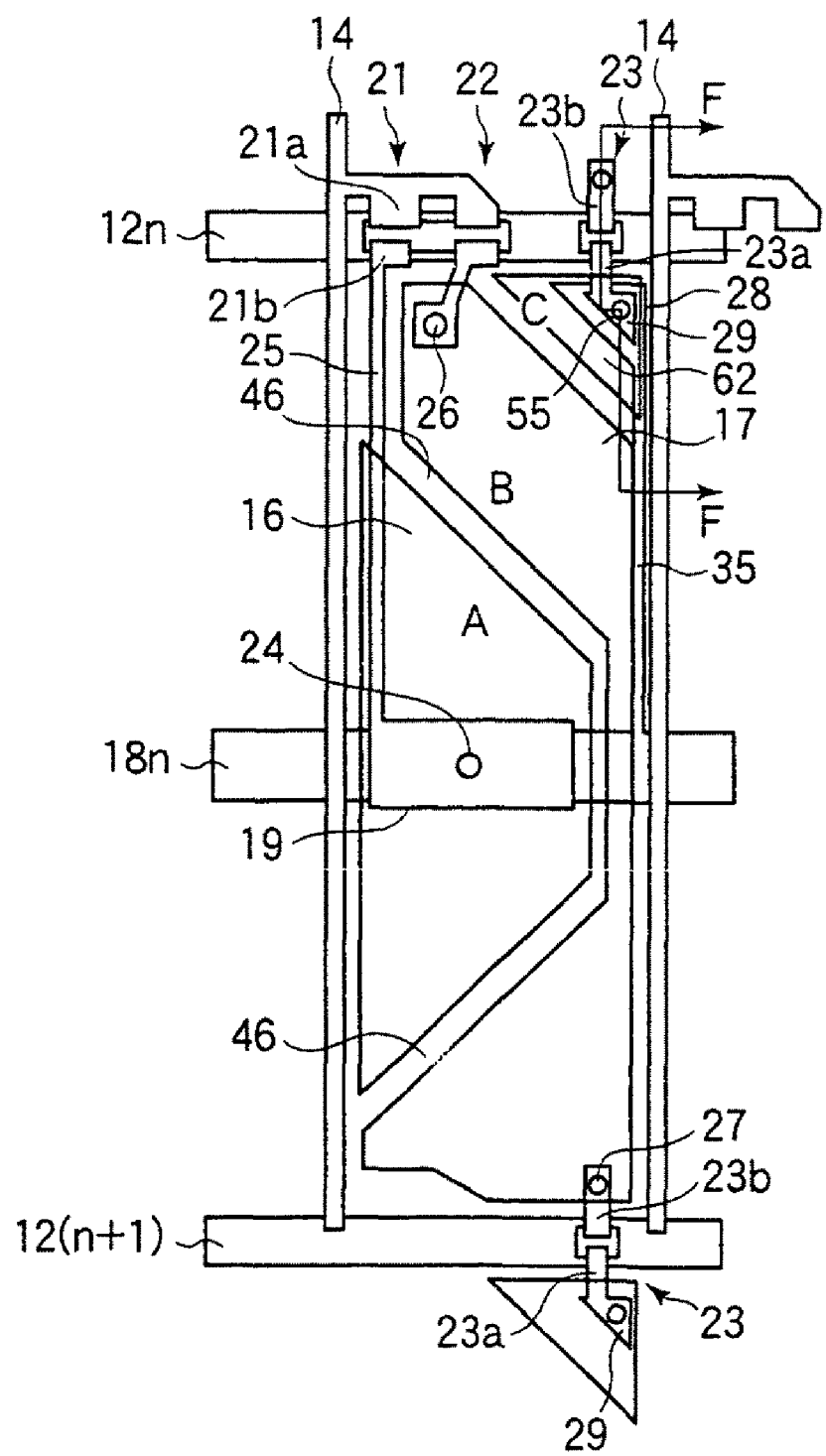
FIG. 12 shows a liquid crystal display device according to a fifth principle of the embodiment of the invention.
Figure 13:
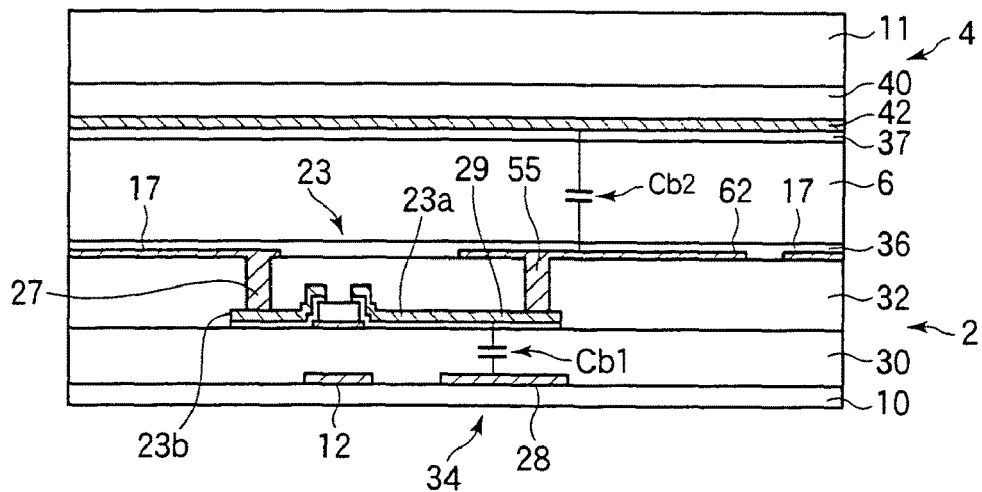
FIG. 13 shows a liquid crystal display device according to a fifth principle of the embodiment of the invention.

FIGS. 12 and 13 show the fifth principle of the embodiment. FIG. 12 shows the configuration of one pixel of a liquid crystal display device, and FIG. 13 is a sectional view taken along line F-F in FIG. 12. As shown in FIGS. 12 and 13, a pixel electrode 62 is formed which is formed in the same layer as the pixel electrodes 16 and 17 and is electrically connected to the buffer capacitance electrode 29 via a contact hole 55. The region of formation of the pixel electrode 62 contributes to display as a sub-pixel C. The pixel electrode 62 and that part of the common electrode 42 which is opposed to it also function as buffer capacitance electrodes. A capacitor Cb2 which is parallel with a capacitor Cb1 is formed by the pixel electrode 62, the common electrode 42, and those parts of the liquid crystal layer 6 etc. which are interposed between them.

In this structure, the capacitor Cb2 which is part of the capacitor Cb is formed with the liquid crystal layer 6 as a dielectric layer. Since the liquid crystal layer 6 is about 10 times thicker than the insulating film 30 and the protective film 32, the electrode area of the pixel electrode 62 needs to be set large. However, since the region of formation of the pixel electrode 62 contributes to display as the sub-pixel C, the aperture ratio of each pixel is increased.

Liquid crystal display devices according to the embodiment will be described below in the form of specific examples.

Example 1

Figure 14:
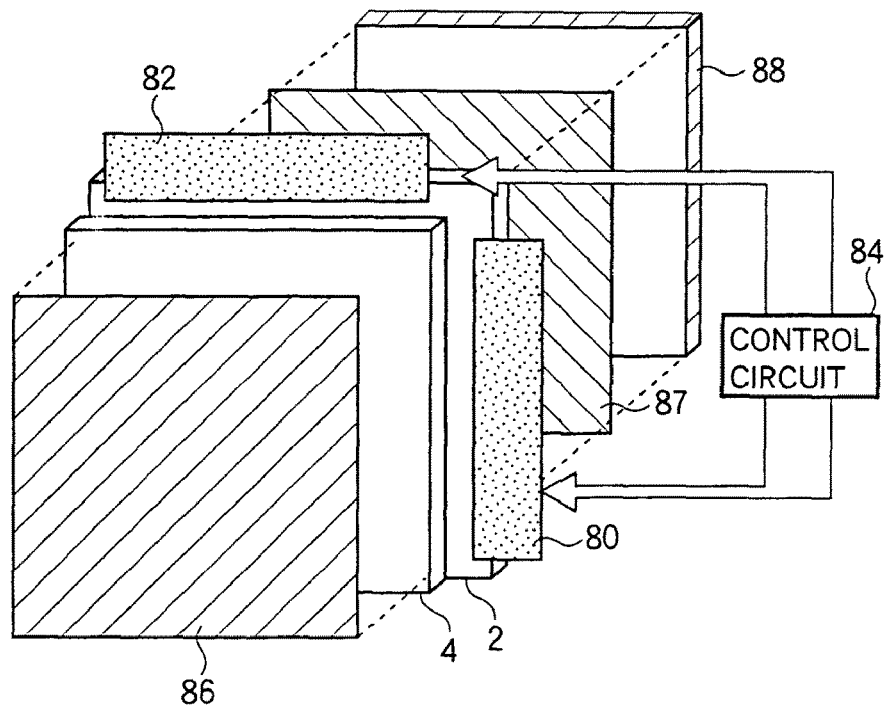
FIG. 14 schematically shows the configuration of a liquid crystal display device according to Example 1 of the embodiment of the invention.

A liquid crystal display device according to Example 1 of the embodiment of the invention will be described. FIG. 14 schematically shows the configuration of the liquid crystal display device according to the embodiment. As shown in FIG. 14, the liquid crystal display device has the TFT substrate 2, the counter substrate 4, and the liquid crystal layer 6 (not shown in FIG. 14) which is sealed between the two substrates 2 and 4.

A gate bus line driving circuit 80 incorporating a driver IC for driving the plural gate bus lines and a drain bus line driving circuit 82 incorporating a driver IC for driving the plural drain bus lines are connected to the TFT substrate 2. The driving circuits 80 and 82 output scanning signals and data signals to prescribed gate bus lines and drain bus lines on the basis of prescribed signals that are output from a control circuit 84. A polarizing plate 87 is disposed on that surface of the TFT substrate 2 which is opposite to its TFT elements formation surface and a polarizing plate 86 is disposed on that surface of the counter substrate 4 which is opposite to its common electrode formation surface, the polarizing plates and 87 being in a crossed-Nicols arrangement. A backlight unit 88 is disposed on that surface of the polarizing plate 87 which is opposite to the TFT substrate 2.

In Example 1, the buffer capacitance portion 34 having the two layers, that is, the insulating film 30 and the protective film 32, as a dielectric layer is formed according to the first principle shown in FIGS. 8A and 8B. The thickness of both of the insulating film 30 and the protective film 32 is set at 350 nm. Since the capacitance per unit area is about ½ of that of a case that only one of the insulating film 30 and the protective film 32 is employed as a dielectric layer, the electrode areas of the buffer capacitance electrodes 28 and 60 are set about two times larger. Therefore, the allowance for the dimensional errors of the buffer capacitance electrodes 28 and 60 increases to about two times.

Figure 15A:
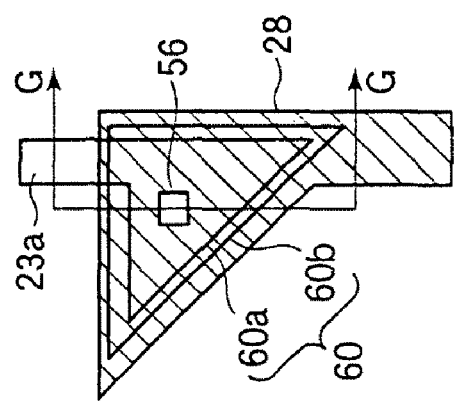
FIGS. 15A and 15B show the configuration of a liquid crystal display device according to Example 1 (modification) of the embodiment of the invention.
Figure 15B:
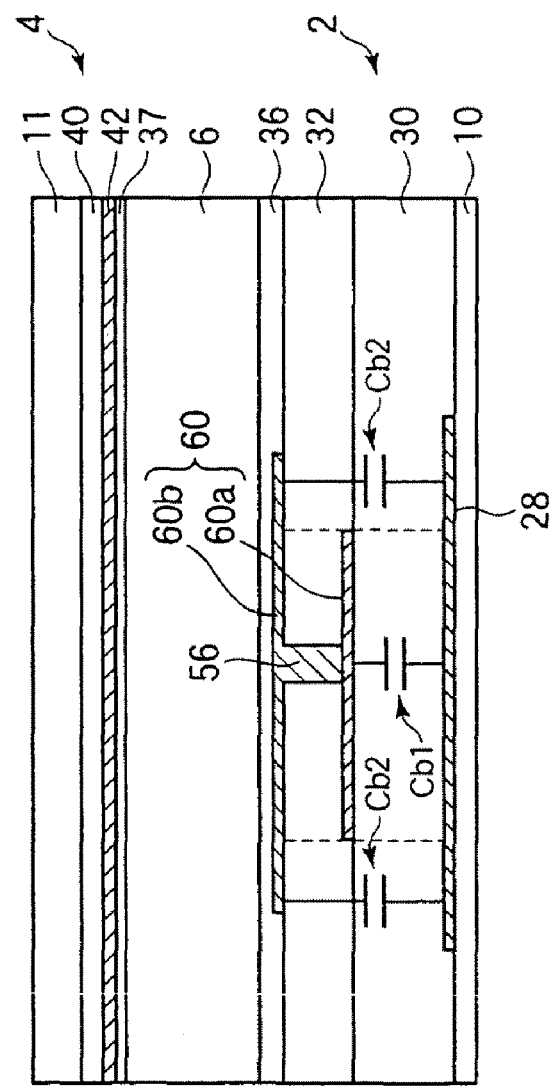

FIG. 15A shows the structure of the buffer capacitance portion 34 of a liquid crystal display device according to Example 1 (modification). FIG. 15B is a sectional view of the liquid crystal display device taken along line G-G in FIG. 15A. As shown in FIGS. 15A and 15B, the buffer capacitance electrode 60 has a sub-electrode 60a which is electrically connected the drain electrode 23a of the TFT 23 and formed in the same layer as the drain electrode 23a and a sub-electrode 60b which overlaps with the sub-electrode 60a when viewed perpendicularly to the substrate surfaces, is electrically connected to the sub-electrode 60a via a contact hole 56, and is formed in the same layer as the pixel electrodes 16 and 17. When the sub-electrodes 60a and 60b and the buffer capacitance electrode 28 are viewed perpendicularly to the substrate surfaces, the sub-electrode 60a is the innermost electrode and the buffer capacitance electrode 28 is the outermost electrode. In the region of formation of the sub-electrodes 60a and 60b and the buffer capacitance electrode 28, a capacitor Cb1 is formed by the sub-electrode 60a, the buffer capacitance electrode 28, and that part of the insulating film 30 which is interposed between them. In the region outside the sub-electrode 60a where only parts of the sub-electrode 60b and the buffer capacitance electrode 28 are formed, a capacitor Cb2 is formed by the sub-electrode 60b, the buffer capacitance electrode 28, and those parts of the insulating film 30 and the protective film 32 which are interposed between them. The buffer capacitance Cb is the sum of the capacitances Cb1 and Cb2.

Consideration will be given to a case that dimensional errors occur in the sub-electrodes 60a and 60b and the buffer capacitance electrode 28 in patterning. Even if a dimensional error occurs in the outermost buffer capacitance electrode 28, the buffer capacitance Cb does not vary. If the innermost sub-electrode 60a is patterned so as to be smaller than its regular size, the capacitance Cb1 decreases but the capacitance Cb2 increases. Conversely, if the sub-electrode 60a is patterned so as to be larger than its regular size, the capacitance Cb1 increases but the capacitance Cb2 decreases. Therefore, in either case, the influence of the dimensional error on the buffer capacitance Cb is small.

If a dimensional error occurs in the sub-electrode 60b, the capacitance Cb2 varies. However, capacitance Cb2 is formed with the two layers, that is, the insulating film 30 and the protective film 32, as a dielectric layer, the two layers combined are naturally thicker than the insulating film 30. That is, the interval between the sub-electrode 60b and the buffer capacitance electrode 28 is longer than the interval between the sub-electrode 60a and the buffer capacitance electrode 28. Therefore, the variation in the capacitance Cb2 is smaller than a variation that would occur in the capacitance Cb1 (only the insulating film 30 serves as a dielectric layer) by the same amount of dimensional error. If both of the sub-electrodes 60a and 60b are patterned so as to be smaller or larger than their regular sizes, the influence is the same as in the case of the conventional structure. However, the probability that the electrode areas of the sub-electrodes 60a and 60b are varied in the same direction at the same time is low in terms of the process, and hence the risk is avoided. In this modification, since the buffer capacitance electrodes 28 and 60 need not be as large as in the structure of FIGS. 8A and 8B, the degree of reduction in the aperture ratio can be lowered and the margins of manufacture can be increased. The same advantages can also be obtained by making the sub-electrode 60*b*, instead of the buffer capacitance electrode 28, an outermost electrode. As described above, Example 1 can solve the problem (1) of the liquid crystal display device having the 3-TFT halftone structure.

Example 2

A liquid crystal display device according to Example 2 of the embodiment will be described. In Example 2, as already shown in FIG. 9, the column-shaped spacer 47 is disposed in the region of formation of the buffer capacitance portion 34. The permittivity ∈ of a liquid crystal varies depending on the alignment state and the voltage application state and hence is a factor of variation of the buffer capacitance Cb (Cb2). In contrast, in Example 2, the capacitance Cb2 is stable because that part of the liquid crystal which is located in the buffer capacitance portion 34 is removed by the column-shaped spacer 47. Incidentally, the buffer capacitance electrodes 28 and 29 of the buffer capacitance portion 34 are usually made of an opaque metal. Therefore, the region of formation of the buffer capacitance portion 34 does not contribute to display and hence is a factor of reduction of the aperture ratio. Example 2 provides an additional advantage that the degree of reduction of the aperture ratio can be lowered by forming the column-shaped spacer 47, which can also be a factor of reduction of the aperture ratio, so as to overlap with the region of formation of the buffer capacitance portion 34.

Figure 16:
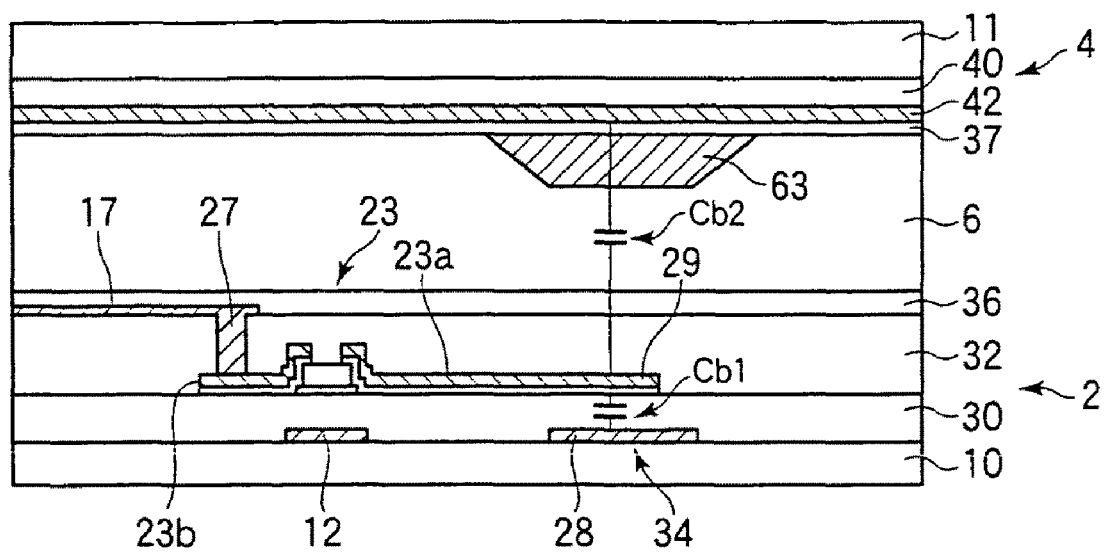
FIG. 16 shows the configuration of a liquid crystal display device according to Example 2 (modification) of the embodiment of the invention.

FIG. 16 shows the configuration of a liquid crystal display device according to Example 2 (modification) of the embodiment. In this modification, instead of the column-shaped spacer 47, at least part of an insulative projection 63 which is used as an alignment restriction structure for restricting the alignment of the liquid crystal in the MVA-type device is disposed in the region of formation of the buffer capacitance portion 34 on the side of the counter substrate 4. In this modification, the liquid crystal in the region of formation of the buffer capacitance portion 34 is not removed completely. However, since the voltage applied to the liquid crystal layer 6 is decreased by a voltage drop in the insulative projection 63, the variation in the capacitance Cb can be reduced accordingly.

The structure of FIG. 10 can be another modification that is classified as Example 2. In this modification, instead of the column-shaped spacer 47, the opening 43 such as a slit that is used as an alignment restriction structure is disposed in the region of formation of the buffer capacitance portion 34 on the side of the counter substrate 4. In this modification, although the liquid crystal is left in the region of formation of the buffer capacitance portion 34, no voltage is applied to the related part of the liquid crystal layer 6 because the common electrode 42 is removed in this region. The variation of the capacitance Cb can thus be prevented. As described above, Example 2 can solve the problem (1) of the liquid crystal display device having the 3-TFT halftone structure.

Example 3

In Example 3, according to the fourth principle shown in FIGS. 11A and 11B, the buffer capacitor Cb is formed by the buffer capacitance electrode 61 which is formed in the same layer as the pixel electrodes 16 and 17 and is electrically connected to the connection electrode 35 and the storage capacitance bus line 18 via the contact hole 54, the buffer capacitance electrode 29 which coextends with part of the buffer capacitance electrode 61 and extends from the drain electrode 23*a* of the TFT 23, and that part of the protective film 32 which is interposed between them. Since the thickness of the protective film 32 can be changed more easily than that of the insulating film 30, in Example 3 the thicknesses of the insulating film 30 and the protective film 32 were set at 350 nm and 150 nm, respectively. With these settings, a buffer capacitance Cb which was 2.3 (350/150) times larger than in the case where the insulating film 30 was used as a dielectric layer was obtained in the case where the electrode area was the same.

Figure 17A:
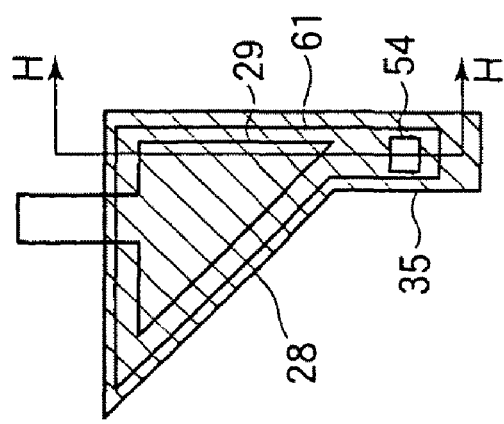
FIGS. 17A and 17B show the configuration of a liquid crystal display device according to Example 3 (modification) of the embodiment of the invention.
Figure 17B:
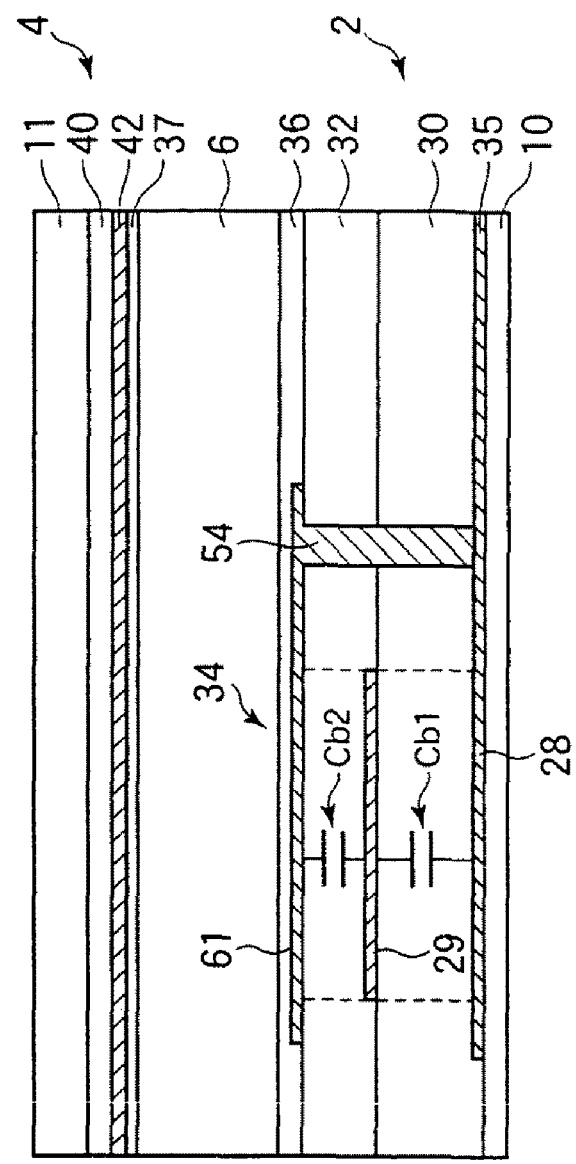

FIGS. 17A and 17B show the configuration of a liquid crystal display device according to Example 3 (modification). FIG. 17A shows the structure of the buffer capacitance portion 34, and FIG. 17B is a sectional view taken along line H-H in FIG. 17A. This modification is the same as the structure of FIGS. 11A and 11B in that a capacitor Cb2 is formed by the buffer capacitance electrodes 29 and 61 and the protective film 32. In addition, a capacitor Cb1 is formed by the buffer capacitance electrode 29, a buffer capacitance electrode 28 which extends from the storage capacitance bus line 18 and overlaps with the buffer capacitance electrode 29, and that part of the insulating film 30 which is interposed between them. The capacitor Cb1 is parallel with the capacitor Cb2. The buffer capacitance electrode 29 is formed in the layer that is located between the layers of the two buffer capacitance electrodes (sub-electrodes) 28 and 61 that are given the same potential, that is, the buffer capacitance electrode 29 is interposed between the buffer capacitance electrodes 28 and 61 in the vertical direction. This structure is more efficient because the buffer capacitance Cb is the sum of the capacitances Cb1 and Cb2. When the thicknesses of the insulating film 30 and the protective film 32 were set at 350 nm and 150 nm, respectively, a buffer capacitance Cb which was 3.3 (350/150+1) times larger than in the case where only the insulating film 30 was used as a dielectric layer was obtained in the case where the electrode area was the same.

When the buffer capacitance electrodes 28, 29, and 61 are viewed perpendicularly to the substrate surfaces, the buffer capacitance electrode 29 is located inside the buffer capacitance electrodes 28 and 61. Therefore, even if a dimensional error occurs in the buffer capacitance electrode 28 or 61, the buffer capacitance Cb does not vary. As described above, Example 3 can solve the problems (1) and (2) of the liquid crystal display device having the 3-TFT halftone structure.

Example 4

In the configuration of FIGS. 12 and 13, the large pixel electrode (buffer capacitance electrode) 62 is formed in the same layer as the pixel electrodes 16 and 17 and the buffer capacitor Cb2 which is part of the capacitor Cb is formed by using the liquid crystal layer 6 as a dielectric layer. This configuration is similar to the configuration of FIGS. 8A and 8B. Since the liquid crystal layer 6 is about 10 times thicker than the insulating film 30 or the protective film 32, an about 10 times larger electrode area is necessary for providing the same level of capacitance: this configuration is not efficient. However, in Example 4, since the region of formation of the pixel electrode 62 contributes to display as the sub-pixel C, the aperture ratio of each pixel is increased greatly.

Figure 18:
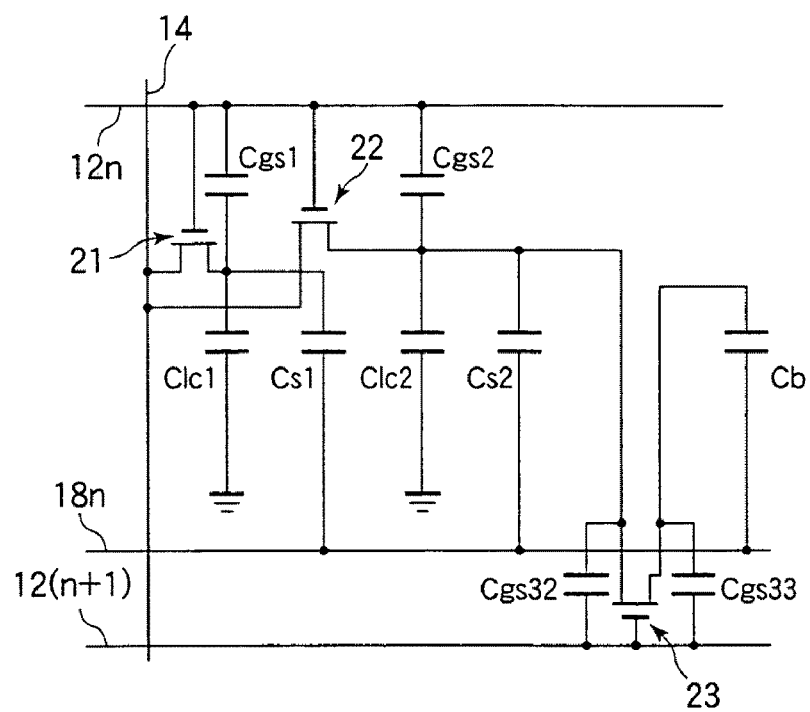
FIG. 18 is an equivalent circuit of one pixel of a liquid crystal display device according to Example 4 of the embodiment of the invention.
Figure 19:
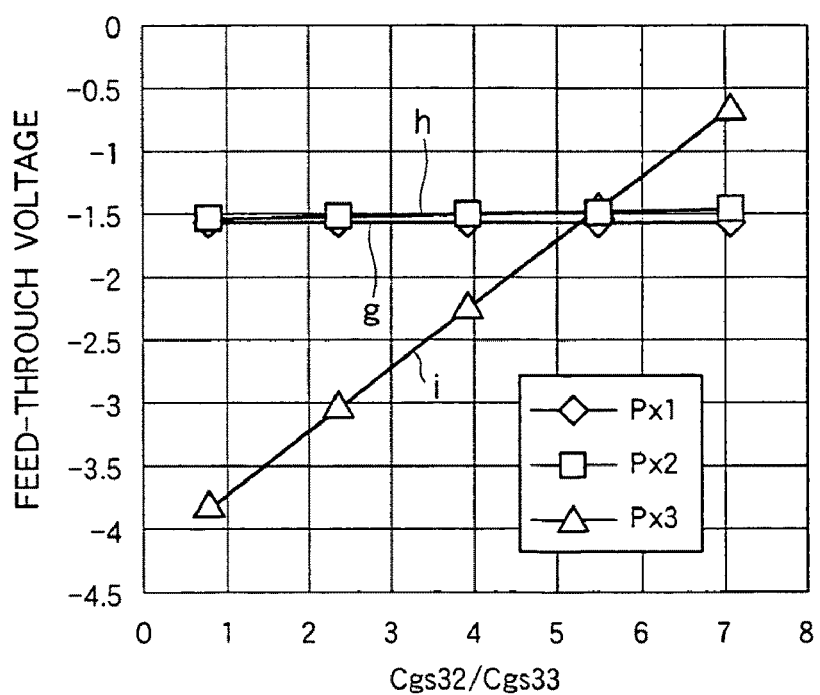
FIG. 19 is a graph showing feed-through voltages in the liquid crystal display device according to Example 4 of the embodiment of the invention.
Figure 20:
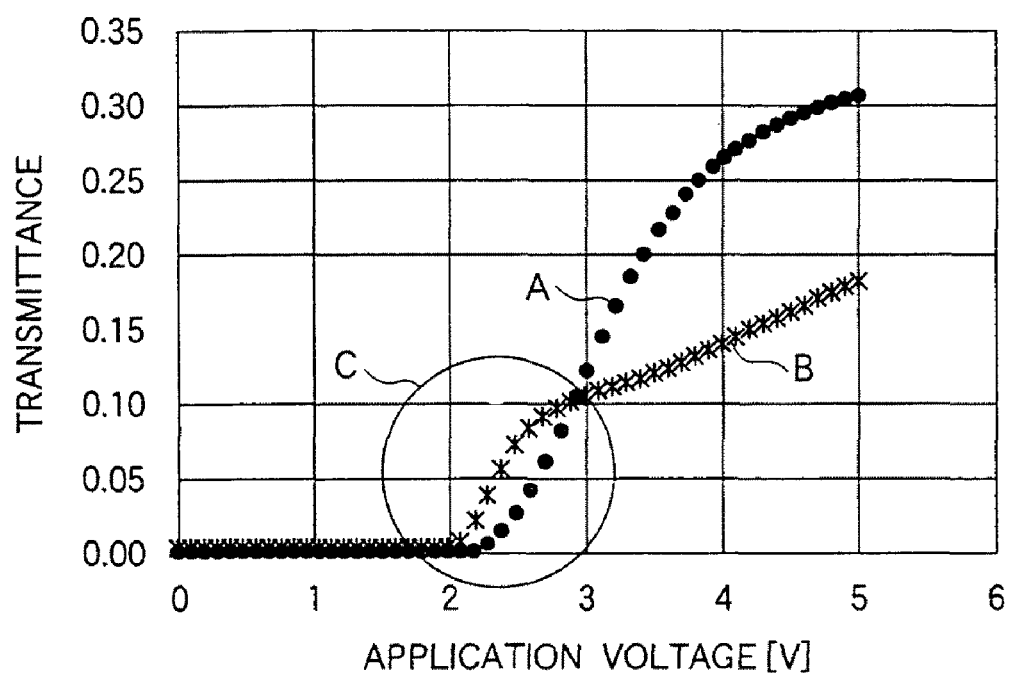
FIG. 20 is a graph showing T-V characteristics of a VA-mode liquid crystal display device.

However, to utilize the region of formation of the pixel electrode 62 as the sub-pixel C, it is necessary to make a feed-through voltage for the sub-pixel C equal to feed-through voltages for the other sub-pixels A and B. In general, the feed-through voltage is determined by the ratio between the liquid crystal capacitance Clc and the parasitic capacitance Cgs between the gate electrode of the TFT and the pixel electrode. FIG. 18 is an equivalent circuit of one pixel of the liquid crystal display device according to Example 4. As shown in FIG. 18, there are four parasitic capacitances Cgs1, Cgs2, Cgs32, and Cgs33. FIG. 19 is a graph showing a result of a study on values of these parasitic capacitances Cgs. The horizontal axis of the graph represents the ratio Cgs32/Cgs33 between the parasitic capacitances Cgs32 and Cgs33, and the vertical axis represents the feed-through voltage. Lines g, h, and i indicate feed-through voltages for the sub-pixel A (Px1), sub-pixel B (Px2), and sub-pixel C (Px3), respectively. It is seen from FIG. 19 that the feed-through voltage for the sub-pixel C can be made equal to the feed-through-voltages for the sub-pixels A and B by setting the ratio Y (=Cgs32/Cgs33) of the parasitic capacitance Cgs32 between the TFT 23 and the sub-pixel B (pixel electrode 17) to the parasitic capacitance Cgs33 between the TFT 23 and the sub-pixel C (pixel electrode 62) at about 5 to 6. That is, the intended result can be obtained by making the ratio Y of the parasitic capacitance Cgs32 to the parasitic capacitance Cgs33 approximately equal to the ratio X (=(Clc2+Cs2)/Cb) of the sum of the liquid crystal capacitance Clc2 of the sub-pixel B and the storage capacitance Cs2 to the buffer capacitance Cb (Cgs32/Cgs33=(Clc2+Cs2)/Cb). With this measure, the differences between the center values of voltages (e.g., voltages whose polarity is inverted every frame) applied to those parts of the liquid crystal layer 6 which are located in the sub-pixels A, B, and C, respectively, are made less than about 0.1 V.

Another technique is to provide a leak resistance portion which connects the pixel electrode 17 of the sub-pixel B and the pixel electrode 62 of the sub-pixel C through an off-leak resistance that is large enough to equalize the potentials of the pixel electrodes 17 and 62 in one frame period. With this measure, the differences between the center values of voltages applied to those parts of the liquid crystal layer 6 which are located in the sub-pixels A, B, and C, respectively, are made less than about 0.1 V, which allows the region of formation of the pixel electrode 62 to be used as the sub-pixel C. As described above, Example 4 can solve the problem (2) of the liquid crystal display device having the 3-TFT halftone structure.

As described above, in the liquid crystal display device having the 3-TFT halftone structure which is different from the structure based on the conventional capacitive coupling HT method, the embodiment makes it possible to prevent variation of the buffer capacitance Cb which causes display unevenness as well as to prevent reduction of the aperture ratio. As a result, a high-luminance, wide-viewing-angle liquid crystal display device can be realized which hardly suffers burn-in damage and stably exhibits display characteristics that are free of display unevenness. Although the pixel configurations of the embodiment are basically intended for application to a liquid crystal display device of the VA mode such as the MVA mode, the principles and the advantages of the embodiment are not restricted to the VA mode and the embodiment can also be applied to a liquid crystal display device of every liquid crystal mode such as the TN, IPS, or OCB mode.

The invention is not limited to the above embodiment and various modifications are possible. For example, although the above embodiment is directed to the transmission-type liquid crystal display device, the invention is not limited to it and can also be applied to liquid crystal display devices of other types such as the reflection type and the semi-transmission type.

Although the above embodiment is directed to the liquid crystal display device in which the CF resin layer 40 is formed on the counter substrate 4, the invention is not limited to it and can also be applied to a liquid crystal display device having what is called the CF-on-TFT structure in which a CF resin layer is formed on the TFT substrate 2.

What is claimed is:

1. A liquid crystal display device comprising:
   a pair of substrates opposed to each other;
   a liquid crystal layer sealed between the substrates;
   a plurality of gate bus lines formed on one of the substrates so as to be parallel with each other;
   a plurality of drain bus lines formed so as to cross the gate bus lines with an insulating film interposed in between;
   a plurality of storage capacitance bus lines formed parallel with the gate bus lines;
   first and second transistors each having a gate electrode electrically connected to an nth gate bus line and a drain electrode electrically connected to one of the drain bus lines;
   a first pixel electrode electrically connected to a source electrode of the first transistor;
   a second pixel electrode which is electrically connected to a source electrode of the second transistor and is separated from the first pixel electrode;
   a pixel region having at least a first sub-pixel in which the first pixel electrode is formed and a second sub-pixel in which the second pixel electrode is formed;
   a third transistor having a gate electrode electrically connected to an (n+1)th gate bus line, a source electrode connected or coupled to the second pixel electrode, and a drain electrode connected or coupled to one of the storage capacitance bus lines;
   a buffer capacitance portion which establishes capacitive coupling between the drain electrode of the third transistor and the storage capacitance bus line or between the source electrode of the third transistor and the second pixel electrode;
   an extending portion electrically connected to the (n+1)th gate bus line and extending in parallel with the (n+1)th gate bus line; and
   wherein the gate electrode of the third transistor is provided in the extending portion.

2. The liquid crystal display device according to claim 1, wherein the buffer capacitance portion comprises a first buffer capacitance electrode electrically connected to the drain electrode of the third transistor, a second buffer capacitance electrode which is opposed to the first buffer capacitance electrode and is electrically connected to the storage capacitance bus line, and a dielectric layer interposed between the first and second buffer capacitance electrodes.

3. The liquid crystal display device according to claim 2, wherein:
   the first buffer capacitance electrode has a first sub-electrode formed in the same layer as the drain electrode of the third transistor and a second sub-electrode which is formed in the same layer as the first or second pixel electrode, overlaps with the first sub-electrode when viewed perpendicularly to substrate surfaces, and is electrically connected to the first sub-electrode; and
   the buffer capacitance portion has a capacitor formed between the first sub-electrode and the second buffer capacitance electrode and a capacitor formed between the second sub-electrode and the second buffer capacitance electrode.

4. The liquid crystal display device according to claim 3, wherein the second buffer capacitance electrode is formed in the same layer as the storage capacitance bus line.

5. The liquid crystal display device according to claim 3, wherein:

an interval between the first sub-electrode and the second buffer capacitance electrode is shorter than an interval between the second sub-electrode and the second buffer capacitance electrode; and the first sub-electrode is located inside the second sub-electrode and the second buffer capacitance electrode when viewed perpendicularly to the substrate surfaces.

6. The liquid crystal display device according to claim 5, wherein the second sub-electrode is located inside the second buffer capacitance electrode when viewed perpendicularly to the substrate surfaces.

7. The liquid crystal display device according to claim 2, wherein:

the second buffer capacitance electrode has a first sub-electrode formed in the same layer as the storage capacitance bus line and a second sub-electrode which is formed in the same layer as the first or second pixel electrode, overlaps with the first sub-electrode when viewed perpendicularly to substrate surfaces, and is electrically connected to the first sub-electrode; and the buffer capacitance portion has a capacitor formed between the first sub-electrode and the first buffer capacitance electrode and a capacitor formed between the second sub-electrode and the first buffer capacitance electrode.

8. The liquid crystal display device according to claim 7, wherein the first buffer capacitance electrode is formed in the same layer as the drain electrode of the third transistor.

9. The liquid crystal display device according to claim 7, wherein the first buffer capacitance electrode is formed in a layer located between the first and second sub-electrodes, and the first buffer capacitance electrode is located inside the first and second sub-electrodes when viewed perpendicularly to the substrate surfaces.

10. The liquid crystal display device according to claim 2, further comprising a common electrode formed on the other of the substrates and a column-shaped spacer for maintaining an interval between the substrates, wherein:

a portion, opposed to the first buffer capacitance electrode, of the common electrode functions as part of the second buffer capacitance electrode; and the column-shaped spacer is formed in a region of formation of the first buffer capacitance electrode and functions as part of the dielectric layer.

11. The liquid crystal display device according to claim 2, further comprising a common electrode formed on the other of the substrates and an insulative projection for restricting alignment of a liquid crystal of the liquid crystal layer, wherein:

a portion, opposed to the first buffer capacitance electrode, of the common electrode functions as part of the second buffer capacitance electrode; and at least part of the insulative projection is formed in a region of formation of the first buffer capacitance electrode.

12. The liquid crystal display device according to claim 2, further comprising a common electrode formed on the other of the substrates, wherein a portion, opposed to at least part of the first buffer capacitance electrode, of the common electrode is removed.

13. The liquid crystal display device according to claim 2, wherein the first buffer capacitance electrode is formed in the same layer as the first or second pixel electrode.

14. The liquid crystal display device according to claim 13, wherein the second buffer capacitance electrode is formed in the same layer as the storage capacitance bus line.

15. The liquid crystal display device according to claim 2, wherein the second buffer capacitance electrode is formed in the same layer as the first or second pixel electrode.

16. The liquid crystal display device according to claim 15, wherein the first buffer capacitance electrode is formed in the same layer as the drain electrode of the third transistor.

17. The liquid crystal display device according to claim 2, further comprising a common electrode formed on the other of the substrates, wherein:

the pixel region further comprises a third sub-pixel in which a third pixel electrode is formed;

the third pixel electrode is electrically connected to the drain electrode of the third transistor and also functions as part of the first buffer capacitance electrode; and a portion, opposed to the third pixel electrode, of the common electrode also functions as part of the second buffer capacitance electrode.

18. The liquid crystal display device according to claim 17, wherein differences between center values of voltages applied to portions, located in the first to third sub-pixels, of the liquid crystal layer are less than or equal to 0.1 V.

19. The liquid crystal display device according to claim 17, wherein a ratio of a sum of a liquid crystal capacitance formed in the second sub-pixel and a storage capacitance to a buffer capacitance formed in the buffer capacitance portion is approximately equal to a ratio of a parasitic capacitance formed between the gate electrode of the third transistor and the second pixel electrode to a parasitic capacitance formed between the gate electrode of the third transistor and the third pixel electrode.

20. The liquid crystal display device according to claim 17, further comprising a leak resistance portion which connects the second and third pixel electrodes through a prescribed resistance and thereby approximately equalizes potentials of the second and third pixel electrodes in one frame period.

* * * * *

UNITED STATES PATENT AND TRADEMARK OFFICE
CERTIFICATE OF CORRECTION

PATENT NO.       : 8,179,492 B2
APPLICATION NO.  : 12/923733
DATED            : May 15, 2012
INVENTOR(S)      : Tasaka et al.

It is certified that error appears in the above-identified patent and that said Letters Patent is hereby corrected as shown below:

Title Page, Item (75) Inventors

Please correct Inventor Yasutoshi Tasaka residence city to show -- Tokyo -- (JP).

Signed and Sealed this
Sixteenth Day of October, 2012

David J. Kappos
*Director of the United States Patent and Trademark Office*